(12) United States Patent
Washio et al.

(10) Patent No.: US 12,009,183 B2
(45) Date of Patent: Jun. 11, 2024

(54) FILM-FORMING METHOD, MANUFACTURING METHOD OF ELECTRONIC DEVICE, AND PLASMA ATOMIC LAYER DEPOSITION APPARATUS

(71) Applicant: THE JAPAN STEEL WORKS, LTD., Tokyo (JP)

(72) Inventors: Keisuke Washio, Kanagawa (JP); Masao Nakata, Kanagawa (JP); Tatsuya Matsumoto, Kanagawa (JP); Junichi Shida, Kanagawa (JP)

(73) Assignee: THE JAPAN STEEL WORKS, LTD., Tokyo (JP)

( * ) Notice: Subject to any disclaimer, the term of this patent is extended or adjusted under 35 U.S.C. 154(b) by 301 days.

(21) Appl. No.: 17/149,696

(22) Filed: Jan. 14, 2021

(65) Prior Publication Data

US 2021/0166922 A1    Jun. 3, 2021

Related U.S. Application Data

(62) Division of application No. 16/490,529, filed as application No. PCT/JP2017/039427 on Oct. 31, 2017, now Pat. No. 11,024,488.

(30) Foreign Application Priority Data

Mar. 8, 2017    (JP) .................................. 2017-044079

(51) Int. Cl.
  *H01J 37/32*    (2006.01)
  *C23C 16/04*    (2006.01)
  (Continued)

(52) U.S. Cl.
  CPC ...... *H01J 37/32669* (2013.01); *C23C 16/042* (2013.01); *C23C 16/403* (2013.01);
  (Continued)

(58) Field of Classification Search
  CPC .......... H01J 37/32669; H01J 37/32743; H01J 37/32834; H01J 2237/332; C23C 16/042;
  (Continued)

(56) References Cited

U.S. PATENT DOCUMENTS 4,963,921 A    10/1990 Kariya et al.
5,164,974 A  * 11/1992 Kariya ................ G03F 7/70733
                                                    378/205
(Continued)

FOREIGN PATENT DOCUMENTS

JP     01-242768 A      9/1989
JP     H11-158605 A     6/1999
(Continued)

OTHER PUBLICATIONS

International Search Report from International Patent Application No. PCT/JP2017/039427, dated Feb. 6, 2018.
(Continued)

*Primary Examiner* — Jarrett J Stark
(74) *Attorney, Agent, or Firm* — Potomac Law Group, PLLC

(57) ABSTRACT

In a film-forming technology using charged particles, a disturbance in film thickness distribution caused by leakage magnetic field is suppressed. A film-forming method embodies a technological idea of switching generation and stop of a magnetic field during a film-forming operation so as to stop the generation of the magnetic field during a period when plasma is generated and generate the magnetic field during a period when plasma is not generated.

2 Claims, 28 Drawing Sheets

ELECTROMAGNET: OFF
PLASMA: ON

(51) Int. Cl.
  *C23C 16/40* (2006.01)
  *C23C 16/455* (2006.01)
  *H01L 21/02* (2006.01)
  *H01L 21/31* (2006.01)
  *H10K 50/844* (2023.01)
  *H10K 71/00* (2023.01)

(52) U.S. Cl.
  CPC .. *C23C 16/45542* (2013.01); *C23C 16/45544* (2013.01); *H01J 37/32743* (2013.01); *H01L 21/02642* (2013.01); *H01L 21/31* (2013.01); *H10K 50/844* (2023.02); *H10K 71/00* (2023.02); *H01J 37/32834* (2013.01); *H01J 2237/332* (2013.01)

(58) Field of Classification Search
  CPC ............ C23C 16/403; C23C 16/45544; C23C 16/45536–45542; H01L 51/5253; H01L 51/56; H01L 21/31; H01L 21/0228; H01L 21/02636–02653; H01L 21/02; H01L 21/02642; H05B 33/04; H05B 33/10
  See application file for complete search history.

(56) References Cited

U.S. PATENT DOCUMENTS

| | | | |
|---|---|---|---|
| 5,608,773 A * | 3/1997 | Korenaga | G03F 7/707 378/208 |
| 6,703,179 B2 * | 3/2004 | Tyan | C23C 14/12 347/262 |
| 7,097,750 B2 * | 8/2006 | Kang | C23C 14/50 118/721 |
| 8,359,999 B2 * | 1/2013 | Kondo | H01L 21/682 118/721 |
| 9,016,234 B2 * | 4/2015 | Ko | C23C 14/12 118/721 |
| 2002/0187265 A1 * | 12/2002 | Mori | C23C 14/12 156/345.31 |
| 2003/0042849 A1 * | 3/2003 | Ogino | H01L 27/3211 313/504 |
| 2004/0031442 A1 * | 2/2004 | Yamazaki | C23C 14/568 118/727 |
| 2004/0035360 A1 * | 2/2004 | Yamazaki | H01L 21/67276 156/345.32 |
| 2004/0127012 A1 * | 7/2004 | Jin | H01J 9/025 438/618 |
| 2005/0011752 A1 * | 1/2005 | Yamazaki | C23C 16/45589 204/192.15 |
| 2005/0034810 A1 * | 2/2005 | Yamazaki | G03F 7/70741 156/345.3 |
| 2006/0011136 A1 * | 1/2006 | Yamazaki | C23C 14/228 118/719 |
| 2006/0197935 A1 * | 9/2006 | Edo | G03F 7/70741 355/75 |
| 2007/0184195 A1 * | 8/2007 | Hatakeyama | H01L 51/0011 427/282 |
| 2008/0118645 A1 * | 5/2008 | Colburn | G03F 7/0002 427/299 |
| 2008/0145521 A1 * | 6/2008 | Guo | H01L 31/18 118/301 |
| 2008/0233272 A1 * | 9/2008 | Ibe | C23C 14/246 427/66 |
| 2009/0208754 A1 * | 8/2009 | Chu | H01L 51/5256 428/411.1 |
| 2010/0163404 A1 * | 7/2010 | De | C23C 14/042 204/192.12 |
| 2011/0048323 A1 * | 3/2011 | Kondo | C23C 14/042 118/500 |
| 2012/0028454 A1 * | 2/2012 | Swaminathan | C23C 16/52 118/704 |
| 2013/0122197 A1 * | 5/2013 | Lee | C23C 16/042 118/721 |
| 2013/0302992 A1 * | 11/2013 | Nozawa | H01J 37/3244 438/758 |
| 2014/0206128 A1 * | 7/2014 | Nakatani | H01L 51/001 438/66 |
| 2014/0262034 A1 * | 9/2014 | Ishibashi | H01J 37/321 118/723 AN |
| 2015/0228663 A1 * | 8/2015 | Youn | H01L 29/7926 438/618 |
| 2015/0228859 A1 * | 8/2015 | Morreale | H01L 33/34 257/29 |
| 2015/0262794 A1 * | 9/2015 | Kihara | H01J 37/32568 216/71 |
| 2016/0122871 A1 * | 5/2016 | Lee | C23C 16/452 118/723 R |
| 2016/0147109 A1 | 5/2016 | Yamazaki et al. | |
| 2016/0260902 A1 * | 9/2016 | Sonoda | C23C 14/12 |
| 2016/0372715 A1 * | 12/2016 | Seo | H01J 37/32366 |
| 2018/0269128 A1 * | 9/2018 | Limaye | H01L 24/83 |
| 2020/0010949 A1 * | 1/2020 | Washio | C23C 16/042 |
| 2020/0013593 A1 * | 1/2020 | Washio | H01J 37/32669 |
| 2020/0277701 A1 * | 9/2020 | Otsuka | C23C 16/56 |

FOREIGN PATENT DOCUMENTS

| | | | |
|---|---|---|---|
| JP | 2008-075128 A | 4/2008 | |
| JP | 2014-003135 A | 1/2014 | |
| JP | 2014-034722 A | 2/2014 | |
| JP | 2016-092316 A | 5/2016 | |
| JP | 2016-206642 A | 12/2016 | |
| JP | 6442994 B2 | 12/2018 | |
| KR | 101490309 B1 * | 2/2015 | |
| WO | WO 2016/170841 A1 | 10/2016 | |
| WO | WO-2018021170 A1 * | 2/2018 | ............ C23C 14/04 |
| WO | WO-2018021196 A1 * | 2/2018 | ............ C09K 11/06 |

OTHER PUBLICATIONS

DD 267593 A; Making hollows in semiconductor wafers having mask held magnetically for mechanical processing via apertures, followed by removal and etching (Year: 1989).

* cited by examiner

FIG. 6
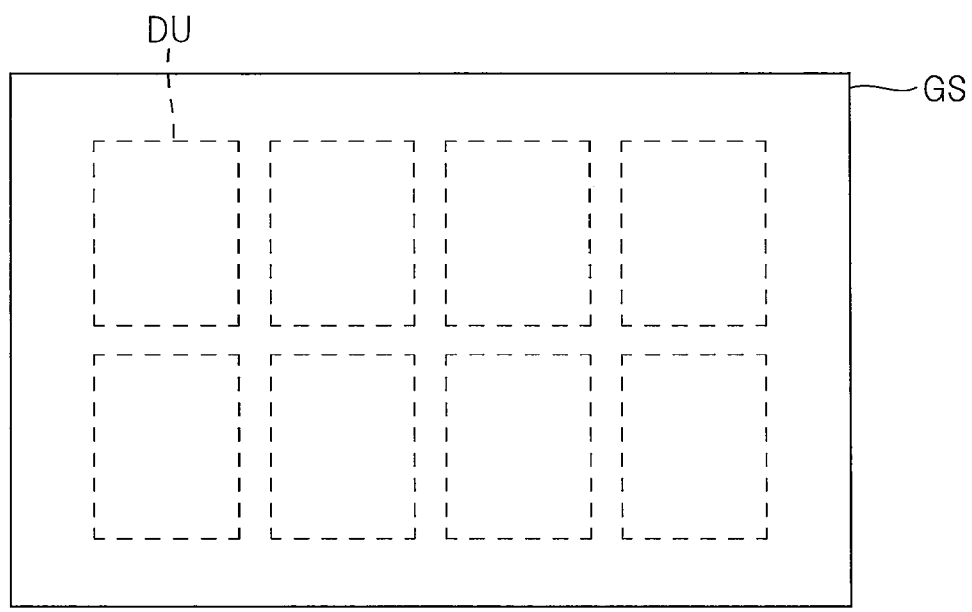
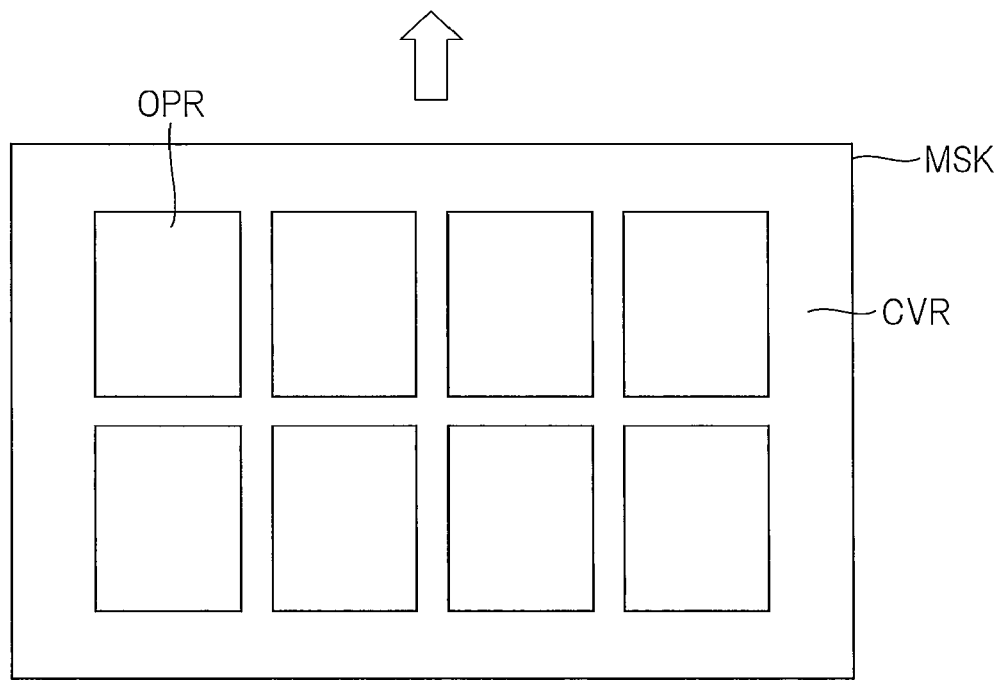

FIG. 7
CVD METHOD
(a)
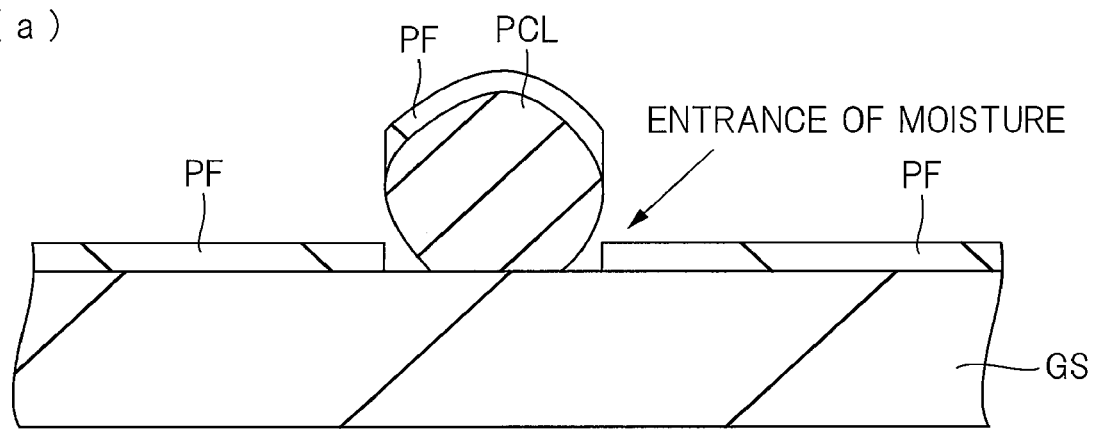
THICKENING
(b)
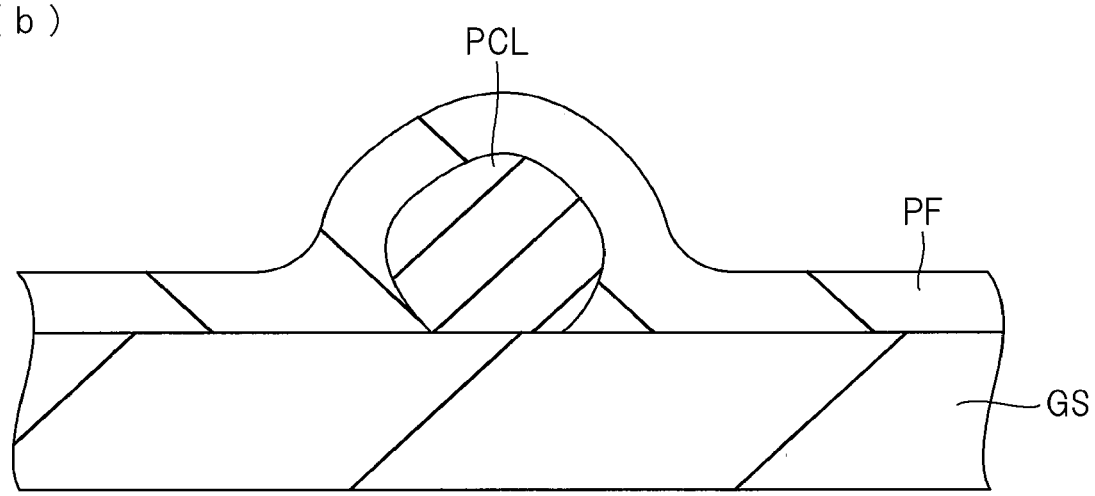

ALD METHOD

PLASMA: OFF

PLASMA: OFF

PLASMA: OFF

PLASMA: OFF

PLASMA: OFF

FILM-FORMING METHOD, MANUFACTURING METHOD OF ELECTRONIC DEVICE, AND PLASMA ATOMIC LAYER DEPOSITION APPARATUS

TECHNICAL FIELD

The present invention relates to a film-forming technology, a manufacturing technology of an electronic device, and a plasma atomic layer deposition apparatus, and relates to, for example, a technology effectively applied when forming a protection film that protects an organic EL (Electro-Luminescence) film.

BACKGROUND ART

Japanese Patent Application Laid-Open Publication No. H11-158605 (Patent Document 1) describes a technology in which, in a state where an electromagnet incorporated in a mask adsorber is excited to adsorb a mask to the mask adsorber, the mask is aligned with a substrate, and then the electromagnet is returned to a non-excited state and the mask is adsorbed to a surface of the substrate with a permanent magnet.

Japanese Patent Application Laid-Open Publication No. 2008-75128 (Patent Document 2) describes a technology of forming a film with less disturbance in film thickness distribution by preventing a magnetic field from leaking to a film-forming space when forming a film by the sputtering method, the plasma CVD method, or the evaporation method using charged particles.

Japanese Patent Application Laid-Open Publication No. 2014-3135 (Patent Document 3) describes a technology of changing an interval between a mask and a substrate by adjusting the magnitude of the current supplied from a current supply unit to an electromagnet.

RELATED ART DOCUMENTS

Patent Documents

Patent Document 1: Japanese Patent Application Laid-Open Publication No. H11-158605
Patent Document 2: Japanese Patent Application Laid-Open Publication No. 2008-75128
Patent Document 3: Japanese Patent Application Laid-Open Publication No. 2014-3135

SUMMARY OF THE INVENTION

Problems to be Solved by the Invention

For example, for suppressing a film from being formed in a gap between a mask and a substrate, a technology of improving an adhesion between the mask and the substrate has been desired. In this respect, a technology of improving the adhesion between the mask and the substrate by attracting the mask by magnetic force in the configuration in which the mask is made of a ferromagnetic substance and a magnetic field generating unit is provided on an opposite side of the mask with a substrate interposed therebetween has been studied.

However, this technology is directed to a film-forming method using uncharged particles typified by, for example, the resistance heating evaporation method. Therefore, when this technology is applied to a film-forming method using charged particles typified by, for example, the sputtering method, the plasma CVD (Chemical Vapor Deposition) method and the plasma ALD (Atomic Layer Deposition) method, the Lorentz force caused by the leakage magnetic field acts on the charged particles, so that a problem of disturbance in film thickness distribution arises. In other words, when the magnetic force is used to improve the adhesion between the mask and the substrate in the film-forming method using charged particles, the charged particles are adversely affected by the leakage magnetic field, so that the contrivance to eliminate the adverse effect of the leakage magnetic field is required.

The other problems and novel characteristics will be apparent from the description of this specification and the accompanying drawings.

Means for Solving the Problems

A film-forming method according to an embodiment embodies a technological idea of switching the generation and stop of the magnetic field during the film-forming operation so that the generation of the magnetic field is stopped in a period when plasma is generated and the magnetic field is generated in a period when plasma is not generated.

Effects of the Invention

According to an embodiment, it is possible to suppress the disturbance in film thickness distribution due to the leakage magnetic field in the film-forming technology using charged particles. As a result, it is possible to improve the film-forming characteristics by the film-forming technology according to the embodiment.

BRIEF DESCRIPTIONS OF THE DRAWINGS

FIG. 1 is a plan view showing a mobile phone (smartphone) seen from a front side;
FIG. 2 is a plan view schematically showing a layout configuration formed in a partial region of a display unit;
FIG. 3 is a cross-sectional view taken along a line A-A of FIG. 2;
FIG. 4 is a flowchart showing a manufacturing process of the display unit;
FIG. 5 is a diagram schematically showing a configuration example of electrically connecting the display unit and a circuit unit;
FIG. 6 is a diagram showing a state in which a mask is disposed over a glass substrate;
FIG. 7(a) is a cross-sectional view showing a state of forming a thin protection film over a glass substrate having a foreign particle adhered thereto by the CVD method, and FIG. 7(b) is a cross-sectional view showing a state of forming a thick protection film over a glass substrate having a foreign particle adhered thereto by the CVD method;
FIG. 8 is a cross-sectional view showing a state of forming a thin protection film over a glass substrate having a foreign particle adhered thereto by the ALD method;
FIG. 9 is a diagram schematically showing a state in which a flexible substrate is used as a substrate of a display unit and this flexible substrate is bent;
FIG. 10 is a flowchart for describing a forming method of a protection film by the plasma atomic layer deposition method;
FIG. 11 is a schematic diagram showing a state in which source gas is introduced into a process chamber of a plasma atomic layer deposition apparatus in a related technology 1;

DETAILED DESCRIPTION OF PREFERRED EMBODIMENTS

Figure 1:
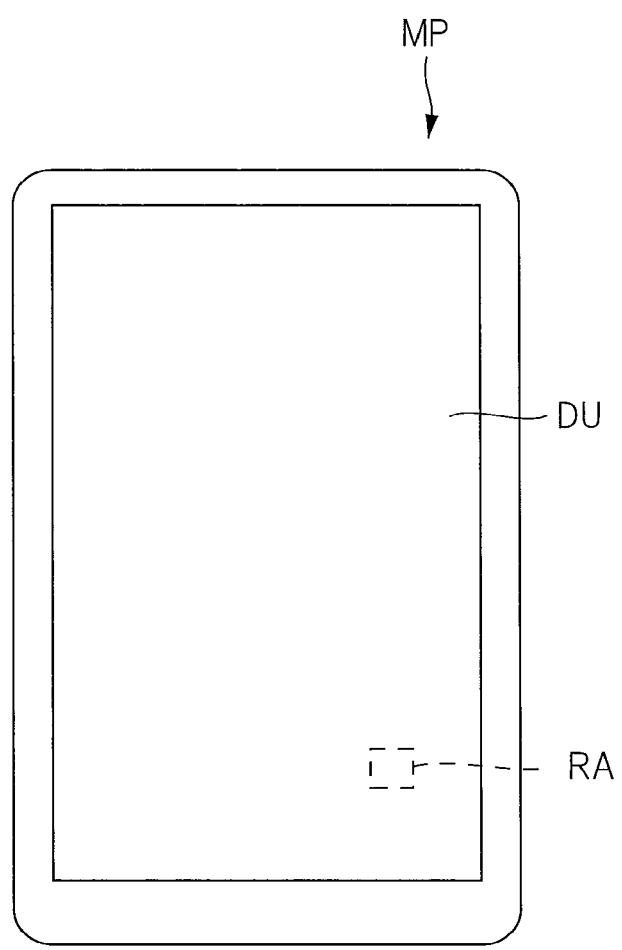

The same components are denoted by the same reference characters throughout the drawings for describing the embodiments, and the repetitive description thereof will be omitted. Note that hatching may be applied in some cases even in a plan view for easy understanding.

<Configuration of Display Unit of Mobile Phone>

FIG. 1 is a plan view showing a mobile phone (smartphone) MP seen from a front side. As shown in FIG. 1, the mobile phone MP according to this embodiment has a substantially rectangular shape and a display unit DU for displaying an image is provided on a front side of the mobile phone MP. For example, the display unit DU according to this embodiment is an organic EL display unit (organic Electro-Luminescence display unit) using an organic EL element. Also, though not shown, the mobile phone MP includes a circuit unit for driving the display unit DU.

In the display unit DU, a plurality of pixels are arranged in an array, which makes it possible to display an image. Various circuits are formed as appropriate in the circuit unit. For example, the circuit unit is configured to include a driving circuit electrically connected to each of the plurality of pixels constituting the display unit DU, and the driving circuit is configured to be able to display an image on the display unit DU by controlling the plurality of pixels constituting the display unit DU.

Figure 2:
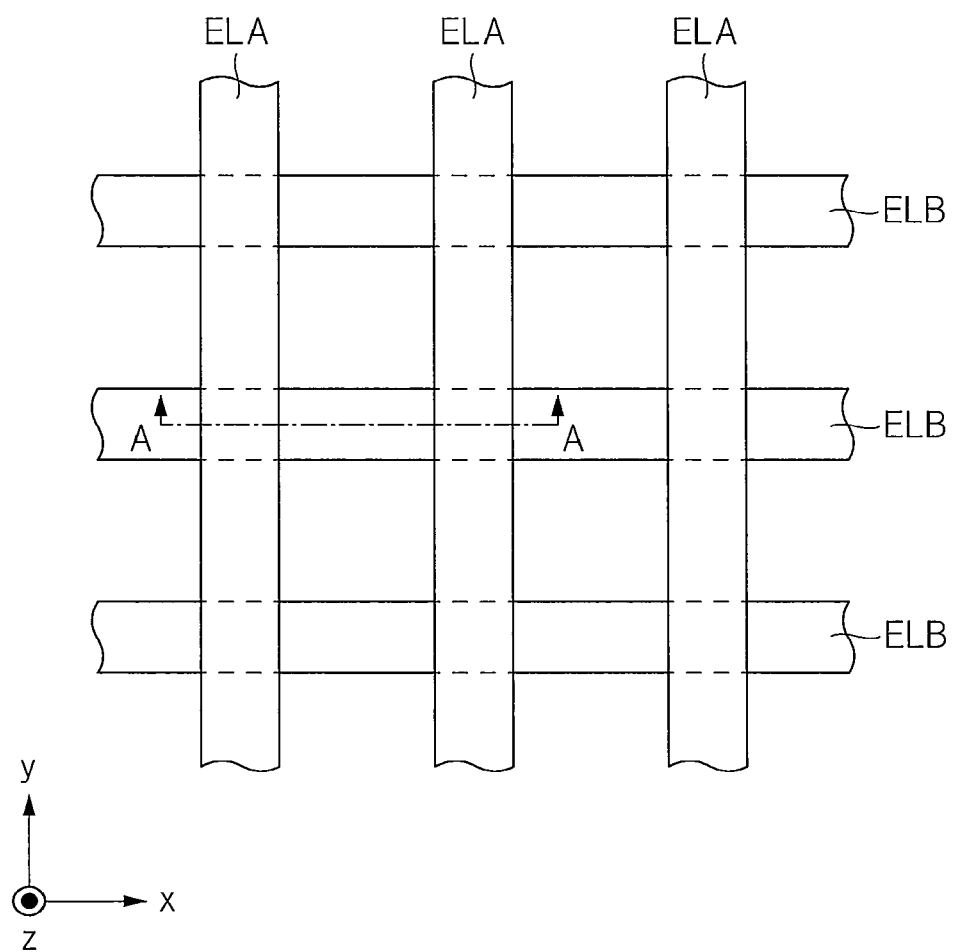

Next, FIG. 2 is a plan view schematically showing a layout configuration formed in a region RA which is a partial region of the display unit DU. As shown in FIG. 2, in the region RA, for example, lower electrode layers ELB each extending in an x direction are arranged in a y direction so as to be separated from each other, and upper electrode layers ELA each extending in the y direction are arranged in the x direction so as to be separated from each other. Therefore, in the region RA, the lower electrode layers ELB and the upper electrode layers ELA are laid out so as to intersect with each other.

Figure 3:
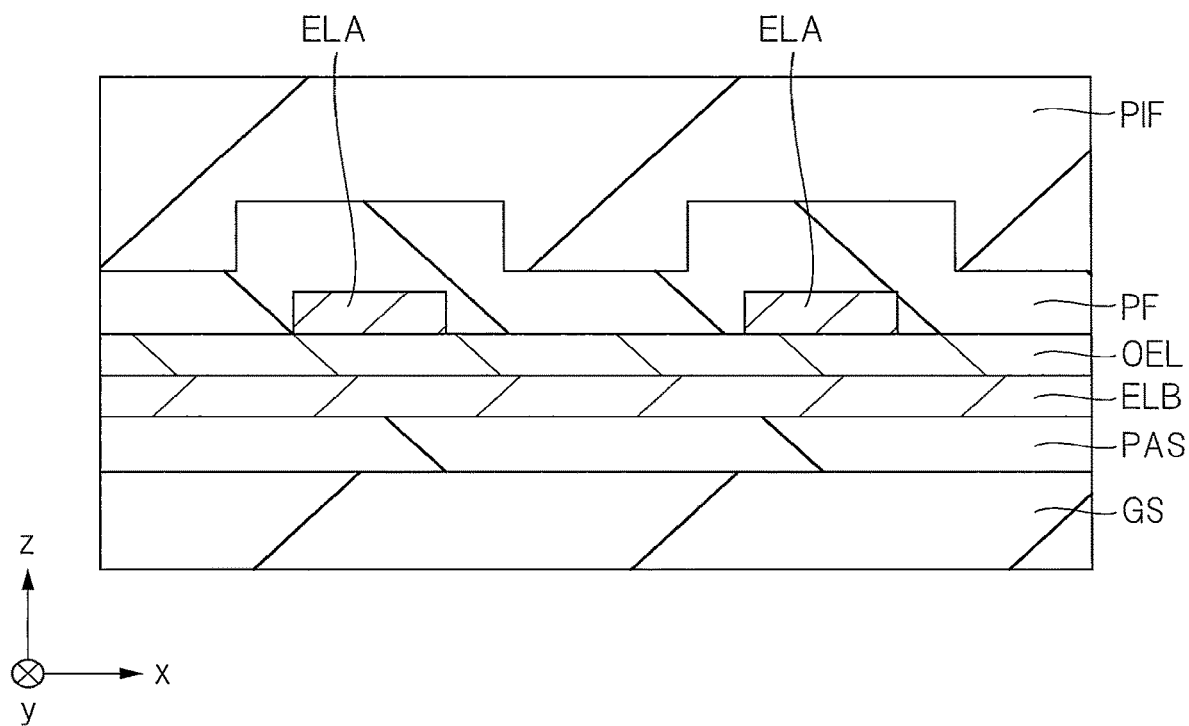

Next, FIG. 3 is a cross-sectional view taken along a line A-A of FIG. 2. As shown in FIG. 3, for example, a passivation film PAS is formed over a glass substrate GS having translucency to visible light. The passivation film PAS is made of an insulating material (insulating film), for example, a silicon oxide film. Although the passivation film PAS may not be formed over the glass substrate GS in some cases, it is more desirable to form the passivation film PAS. The passivation film PAS can be formed over almost entire upper surface of the glass substrate GS.

The passivation film PAS has a function of preventing moisture from entering the organic EL element (in particular, organic layer OEL) from a side of the glass substrate GS. Therefore, the passivation film PAS functions as a protection film on a lower side of the organic EL element. On the other hand, a protection film PF functions as a protection film on an upper side of the organic EL element, and has a function of preventing moisture from entering the organic EL element (in particular, organic layer OEL) from an upper side.

The organic EL element is formed over the upper surface of the glass substrate GS with the passivation film PAS interposed therebetween. The organic EL element is made up of the lower electrode layer ELB, the organic layer OEL, and the upper electrode layer ELA. Namely, over the passivation film PAS over the glass substrate GS, the lower electrode layer ELB, the organic layer OEL, and the upper electrode layer ELA are stacked in this order from below, and the organic EL element is composed of the lower electrode layer ELB, the organic layer OEL, and the upper electrode layer ELA.

The lower electrode layer ELB constitutes one of an anode and a cathode, and the upper electrode layer ELA constitutes the other of the anode and the cathode. Namely, when the lower electrode layer ELB is an anode (anode layer), the upper electrode layer ELA is a cathode (cathode layer), and when the lower electrode layer ELB is a cathode (cathode layer), the upper electrode layer ELA is an anode (anode layer). Each of the lower electrode layer ELB and the upper electrode layer ELA is made of a conductive film.

One of the lower electrode layer ELB and the upper electrode layer ELA is desirably composed of a metal film such as an aluminum film (Al film) so as to be able to function as a reflection electrode. Also, the other of the lower electrode layer ELB and the upper electrode layer ELA is desirably composed of a transparent conductor film made of ITO (indium tin oxide) or the like so as to be able to function as a transparent electrode. When the so-called bottom emission type in which light is emitted from a lower surface side of the glass substrate GS is adopted, the lower electrode layer ELB can be formed as the transparent electrode. On the other hand, when the so-called top emission type in which light is emitted from an upper surface side of the glass substrate GS is adopted, the upper electrode layer ELA can be formed as the transparent electrode. In addition, when the bottom emission type is adopted, a transparent substrate having translucency to visible light can be used as the glass substrate GS.

Since the lower electrode layer ELB is formed over the passivation film PAS over the glass substrate GS, the organic layer OEL is formed over the lower electrode layer ELB, and the upper electrode layer ELA is formed over the organic layer OEL, the organic layer OEL is interposed between the lower electrode layer ELB and the upper electrode layer ELA.

The organic layer OEL includes at least an organic light emission layer. The organic layer OEL can further include any of a hole transport layer, a hole implantation layer, an electron transport layer, and an electron implantation layer as needed in addition to the organic light emission layer. Therefore, for example, the organic layer OEL is configured to have a single layer structure of an organic light emission layer, a stacked layer structure including a hole transport layer, an organic light emission layer, and an electron transport layer, or a stacked layer structure including a hole implantation layer, a hole transport layer, an organic light emission layer, an electron transport layer, and an electron implantation layer.

For example, as shown in FIG. 2, the lower electrode layers ELB form a stripe-shaped pattern extending in the x direction. Namely, a plurality of the lower electrode layers ELB are arranged in the y direction at predetermined intervals while extending in the x direction. On the other hand, the upper electrode layers ELA form a stripe-shaped pattern extending in the y direction. Namely, a plurality of the upper electrode layers ELA are arranged in the x direction at predetermined intervals while extending in the y direction. In other words, the lower electrode layers ELB are made up of a stripe-shaped electrode group extending in the x direction, and the upper electrode layers ELA are made up of a stripe-shaped electrode group extending in the y direction. Here, the x direction and the y direction are directions intersecting with each other, more specifically, directions orthogonal to each other. Also, the x direction and the y direction are directions substantially parallel to the upper surface of the glass substrate GS.

Since the extending direction of the lower electrode layer ELB is the x direction and the extending direction of the upper electrode layer ELA is the y direction, the lower electrode layer ELB and the upper electrode layer ELA intersect with each other in plan view. Note that "in plan view" means the case of being seen on a plane substantially parallel to the upper surface of the glass substrate GS.

At each intersection portion between the lower electrode layer ELB and the upper electrode layer ELA, the organic layer OEL is sandwiched by the lower electrode layer ELB and the upper electrode layer ELA disposed one above the other. Accordingly, at each intersection portion between the lower electrode layer ELB and the upper electrode layer ELA, the organic EL element made up of the lower electrode ELB, the upper electrode ELA, and the organic layer OEL is formed, and the organic EL element forms the pixel. By applying a predetermined voltage between the lower electrode ELB and the upper electrode ELA, the organic light emission layer in the organic layer OEL sandwiched between the lower electrode ELB and the upper electrode ELA emits light.

Note that the organic layer OEL may be formed over the entire display unit DU, and may be formed to have the same pattern as the lower electrode layer ELB. Similarly, the organic layer OEL may be formed to have the same pattern as the upper electrode layer ELA. In any case, the organic layer OEL is present at each intersection portion between the lower electrode layer ELB and the upper electrode layer ELA.

As described above, in the display unit DU, the organic EL elements constituting the pixels are arranged in an array over the glass substrate GS in plan view.

Note that the case in which the lower electrode layers ELB and the upper electrode layers ELA are configured of stripe-shaped patterns is described here. Therefore, in the plurality of organic EL elements (pixels) arranged in an array, the organic EL elements arranged in the x direction have the common lower electrode layer ELB. Meanwhile, the organic EL elements arranged in the y direction have the common upper electrode layer ELA. However, the structure of the organic EL elements arranged in an array is not limited to this and can be changed in various ways.

For example, the case in which the plurality of organic EL elements arranged in an array are not connected by any of the upper electrode layer ELA and the lower electrode layer ELB and are arranged independently is also possible. In this case, each of the organic EL elements is formed of an isolated pattern having a stacked layer structure of the lower electrode layer, the organic layer, and the upper electrode layer, and a plurality of the isolated organic EL elements are arranged in an array. In this case, in each pixel, an active element such as a TFT (Thin Film Transistor) is provided in addition to the organic EL element, and the pixels can be connected through wirings.

The protection film PF is formed over the upper surface of the glass substrate GS (passivation film PAS) so as to cover the organic EL element, that is, the lower electrode layer ELB, the organic layer OEL, and the upper electrode layer ELA. When the organic EL elements are arranged in an array in the display unit DU, the protection film PF is formed so as to cover the organic EL elements arranged in an array. Therefore, the protection film PF is desirably formed over the entire display unit DU. Also, the protection film PF is desirably formed over the almost entire upper surface of the glass substrate GS. By covering the organic EL element with the protection film PF, it is possible to prevent the entrance of moisture into the organic EL element (in particular, entrance of moisture into the organic layer OEL) by the protection film PF.

A resin film PIF is formed over the protection film PF. As a material of the resin film PIF, for example, PET (polyethylene terephthalate) can be used. The formation of the resin film PIF may be omitted. However, the case in which the resin film PIF is formed is more desirable than the case in which the resin film PIF is not formed. Since the resin film PIF is soft, the display unit DU can be easily handled when the resin film PIF is provided. In the manner described above, the display unit DU of the mobile phone MP is configured.

<Manufacturing Method of Display Unit>

Figure 4:
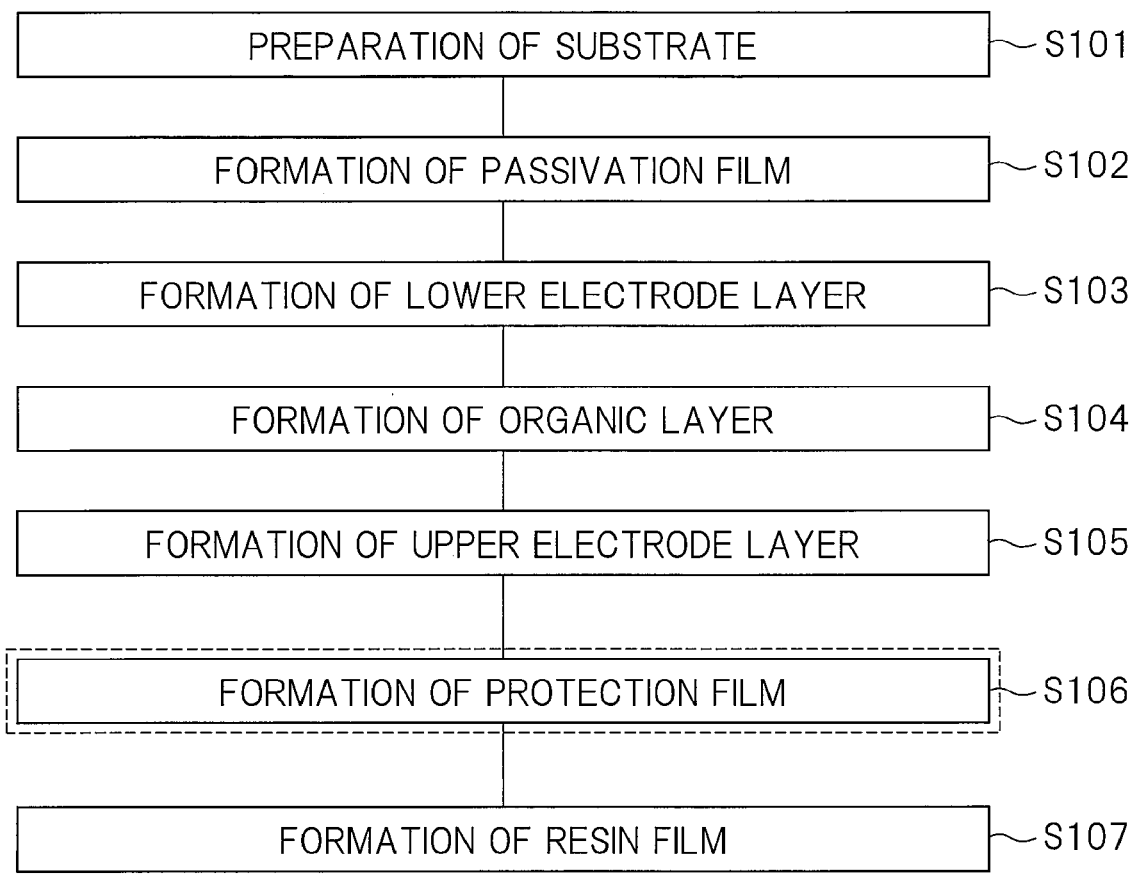

Next, a manufacturing method of the display unit DU will be described with reference to a drawing. FIG. 4 is a flowchart showing a manufacturing process of the display unit DU. First, for example, a glass substrate having translucency to visible light is prepared (S101). Then, the passivation film is formed over the upper surface of the glass substrate (S102). The passivation film can be formed by using, for example, the sputtering method, the CVD (Chemical Vapor Deposition) method, and the ALD (Atomic Layer Deposition) method. The passivation film is made of an insulating material, for example, a silicon oxide film. In particular, a silicon oxide film formed by the CVD method can be used as the passivation film.

Next, the organic EL element made up of the lower electrode layer, the organic layer over the lower electrode layer, and the upper electrode layer over the organic layer is formed over the passivation film. Namely, the lower electrode layer, the organic layer, and the upper electrode layer are formed in this order from below over the passivation film (S103 to S105). For example, this process can be performed as follows.

Namely, the lower electrode layer is formed over the passivation film (S103). For example, the lower electrode layer can be formed by forming a conductive film over the passivation film and patterning the conductive film by the photolithography technology and the etching technology. Thereafter, the organic layer is formed over the lower electrode layer (S104). For example, the organic layer can be formed by the evaporation method (vacuum evaporation method) using a mask. Then, the upper electrode layer is formed over the organic layer (S105). For example, the upper electrode layer can be formed by the evaporation method using a mask.

Subsequently, after the organic EL element made up of the lower electrode layer, the organic layer, and the upper electrode layer is formed, the protection film is formed over the upper electrode (S106). The protection film is formed so as to cover the organic EL element. When a plurality of organic EL elements are arranged in an array, the plurality of organic EL elements are covered with the protection film. The protection film is made of, for example, an aluminum oxide film.

Thereafter, the resin film is formed over the protection film (S107). The resin film is made of, for example, PET and can be formed by the spin coating method. In the manner described above, the display unit DU can be manufactured.

<Connection Configuration between Display Unit and Circuit Unit>

In order to display an image on the display unit, it is necessary to drive and control the plurality of pixels (organic EL elements) constituting the display unit, and the function of driving and controlling the organic EL elements is implemented by the circuit unit. Therefore, in order to display an image on the display unit, it is necessary to electrically connect the display unit to the circuit unit.

Figure 5:
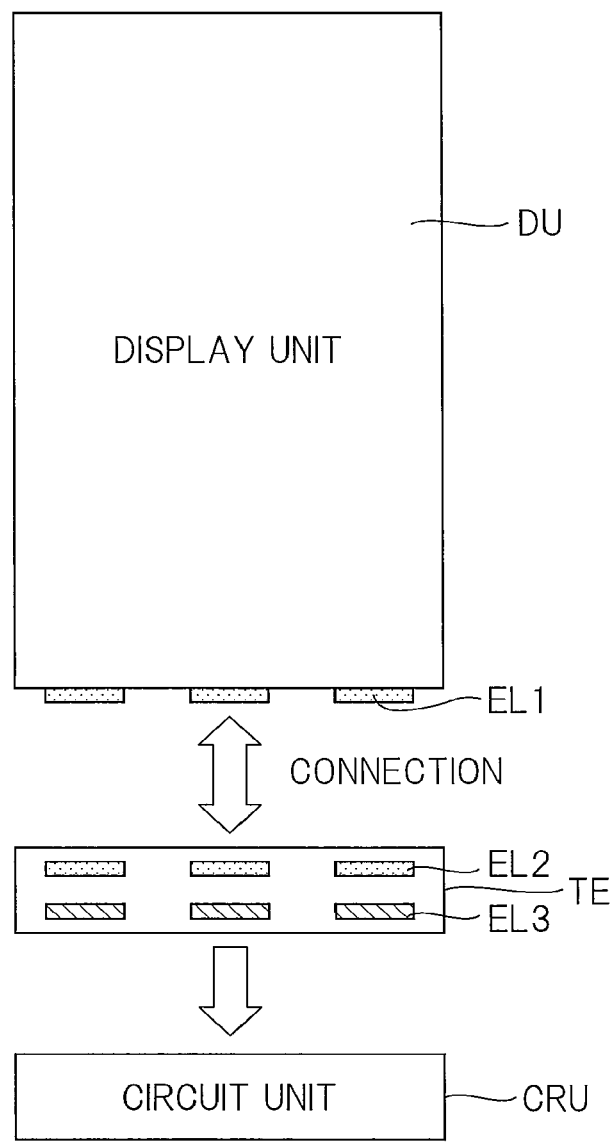

FIG. 5 is a diagram schematically showing a configuration example of electrically connecting the display unit DU and a circuit unit CRU. As shown in FIG. 5, an electrode EL1 electrically connected to the pixels (organic EL elements) constituting the display unit DU is formed in a frame region surrounding the display unit DU, and the electrode EL1 formed in the frame region is electrically connected to the pixels (organic EL elements) constituting the display unit DU. Then, the electrode EL1 is connected to an electrode EL2 formed in a connection tape electrode TE. Further, an electrode EL3 electrically connected to the electrode EL2 is also formed in the connection tape electrode TE together with the electrode EL2, and the electrode EL3 is electrically connected to the circuit unit CRU. Therefore, the display unit DU is electrically connected to the circuit unit CRU through the path of the electrode EL1 formed in the frame region, the electrode EL2 formed in the connection tape electrode TE, and the electrode EL3 formed in the connection tape electrode TE.

Here, by disposing the electrode EL2 formed in the connection tape electrode TE so as to overlap the electrode EL1 formed in the frame region surrounding the display unit DU, the electrode EL1 formed in the frame region is electrically connected to the electrode EL2 constituting the connection tape electrode TE. Accordingly, in order to ensure the electrical connection between the electrode EL1 and the electrode EL2, it is necessary to form the protection film so as not to cover the electrode EL1. This is because when the protection film made of an insulating film is formed so as to cover the electrode EL1, the electrode EL1 cannot be electrically connected to the electrode EL2 of the connection tape electrode TE.

Therefore, it is necessary to form the protection film so as to cover the pixels (organic EL elements) formed in the display unit DU in order to protect the organic EL elements from the entrance of moisture, and further it is necessary to prevent the protection film from being formed in the frame region in which the electrode EL1 is formed in order to ensure the conduction between the electrode EL1 and the electrode EL2 of the connection tape electrode TE.

<Necessity of Mask in Formation of Protection Film>

As described above, it is necessary to form the protection film so as to cover the pixels (organic EL elements) formed in the display unit DU, and it is also necessary to prevent the protection film from being formed in the frame region in which the electrode EL1 is formed. Here, since one glass substrate GS includes a plurality of regions in which the display unit DU is formed as shown in FIG. 6, if the protection film is formed without using the mask over the entire main surface of the glass substrate GS in which the organic EL elements have been formed, the protection film is formed not only over the display unit DU but also over the frame region surrounding the display unit DU. This means that the protection film is formed so as to cover the electrode EL1 formed in the frame region, so that the conduction between the electrode EL1 and the electrode EL2 of the connection tape electrode TE cannot be ensured. Therefore, the mask is necessary when forming the protection film. Namely, as shown in FIG. 6, the protection film is formed in the state where a mask MSK having an opening region OPR corresponding to the display unit DU and a cover region CVR corresponding to the frame region is overlapped with the glass substrate GS. In this case, the protection film is formed in the region (region in which the display unit DU is formed) of the glass substrate GS exposed from the opening region OPR formed in the mask MSK, whereas the protection film is not formed in the region (region to be the frame region) of the glass substrate GS covered with the cover region CVR formed in the mask MSK. As described above, when forming the protection film, the mask MSK having the opening region OPR corresponding to the display unit DU and the cover region CVR corresponding to the frame region is used. As a result, it is possible to form the protection film so as to cover the pixels (organic EL elements) formed in the display unit DU, and it is also possible to prevent the protection film from being formed in the frame region in which the electrode EL1 is formed.

<Reason for Using Atomic Layer Deposition Method (ALD Method) for Formation of Protection Film>

Next, the protection film that protects the organic EL element from the entrance of moisture is formed by, for example, the atomic layer deposition method (ALD method), and the reason therefor will be described below.

The atomic layer deposition method is a film-forming method in which a film is formed over a substrate in a unit of atomic layer by alternately supplying source gas and reaction gas to the substrate. The atomic layer deposition method forms a film in a unit of atomic layer, and thus has an advantage of excellent step coverage and film thickness controllability. Also, according to the atomic layer deposition method having the advantage of excellent step coverage, in particular, a protection film capable of exerting the function of sufficiently protecting the organic EL element from the entrance of moisture can be formed while reducing the film thickness thereof. Therefore, the atomic layer deposition method is used to form the protection film that protects the organic EL element from the entrance of moisture.

For example, the case where the protection film PF is formed over the glass substrate GS having a foreign particle PCL adhered thereto is considered. Here, as a forming method of the protection film PF, the CVD method may be used. However, as the forming tendency of the protection film by the CVD method, the vertical directionality tends to be strong. Therefore, if the protection film PF is formed by the CVD method over the glass substrate GS to which the foreign particle PCL is adhered as shown in FIG. 7(a), the protection film PF is not formed so as to cover the foreign particle PCL due to the tendency of strong vertical directionality. As a result, a dead space in which no protection film PF is formed is formed around the foreign particle PCL, and the entrance of moisture is likely to occur through the dead space. Namely, even when the protection film PF is intended to be formed by the CVD method so as to cover the glass substrate GS to which the foreign particle PCL is adhered, the dead space in which no protection film PF is formed is formed at the step difference portion between the foreign particle PCL and the glass substrate GS due to the tendency of strong vertical directionality, resulting in the entrance of moisture into the organic EL element through the dead space. Therefore, when the protection film PF is formed by the CVD method, for example, the protection film PF is formed so as to completely cover the foreign particle PCL adhered to the glass substrate GS by increasing the thickness of the protection film formed by the CVD method as shown in FIG. 7(b). In other words, when the protection film PF is formed by the CVD method having the strong vertical directionality, the occurrence of the dead space in which no protection film PF is formed at the step difference portion between the foreign particle PCL and the glass substrate GS is suppressed by increasing the thickness of the protection film PF. Namely, since it is difficult to completely suppress the adhesion of the foreign particle PCL to the glass substrate GS, when the CVD method is used to form the protection film PF, the thickness of the protection film PF must be increased in order to effectively prevent the entrance of moisture into the organic EL element by the protection film PF in consideration of the foreign particle PCL adhered to the glass substrate GS.

On the other hand, the case in which the plasma atomic layer deposition method is used as the forming method of the protection film PF is considered. For example, in the plasma atomic layer deposition apparatus, a film is formed in a unit of atomic layer over the substrate by alternately supplying source gas and reaction gas between a lower electrode that holds the substrate and an upper electrode disposed to face the lower electrode and performing plasma discharge when supplying the source gas. At this time, in the plasma atomic layer deposition apparatus, the film is formed in a unit of atomic layer, and thus, the film excellent in step coverage can be formed. In particular, in the plasma atomic layer deposition apparatus, in order to achieve preferable step coverage, a material that easily diffuses is used as the source gas, and each gas (source gas, purge gas, and reaction gas) is alternately supplied while securing the time for sufficiently diffusing each gas in the film-forming container. Therefore, in the plasma atomic layer deposition apparatus, the source gas and the reaction gas react to form the film even in the minute gap. Namely, since the plasma atomic layer deposition apparatus has the characteristics of (1) the film is formed in a unit of atomic layer, (2) the source gas and the reaction gas spread in every corner of the minute gap, and (3) the source gas and the reaction gas easily react even in the place where the plasma discharge is not generated, the film is formed even in the minute gap.

Figure 8:
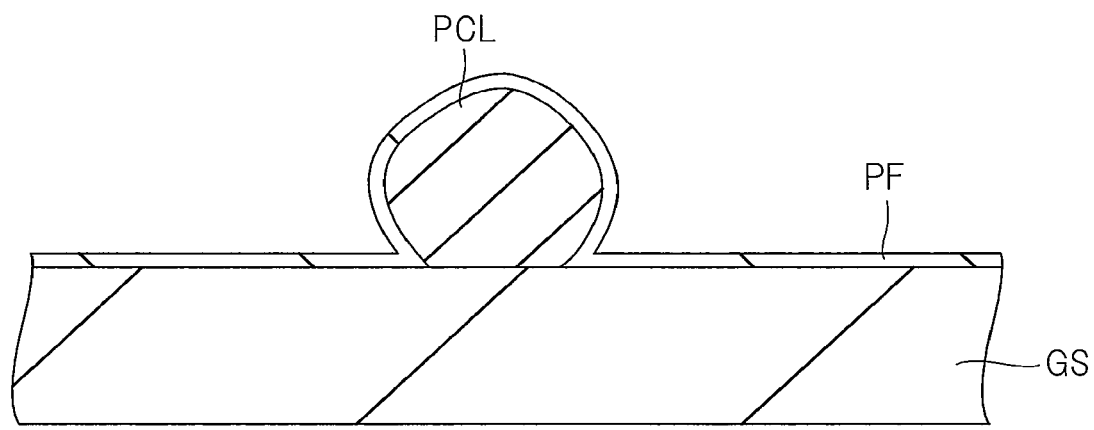

As a result, in the plasma atomic layer deposition method, the advantage of excellent step coverage can be obtained, and thus, the protection film PF can be formed so as to cover the glass substrate GS to which the foreign particle PCL is adhered even if the thickness of the protection film PF is reduced as shown in FIG. 8. Namely, since the plasma atomic layer deposition method is excellent in step coverage, the occurrence of the dead space in which no protection film PF is formed at the step difference portion between the foreign particle PCL and the glass substrate GS can be prevented, and thus, the entrance of moisture into the organic EL element can be effectively suppressed while reducing the thickness of the protection film PF. In other words, when the protection film PF is formed by the plasma atomic layer deposition method, the protection film PF that can effectively suppress the entrance of moisture into the organic EL element can be formed without increasing the film thickness thereof.

As described above, according to the plasma atomic layer deposition method having the advantage of excellent step coverage, even when the foreign particle PCL is adhered to the glass substrate GS, the protection film PF excellent in the prevention of the entrance of moisture can be formed without increasing the film thickness thereof. Accordingly, it is desirable that the protection film PF that effectively protects the organic EL element from the entrance of moisture is formed by using the plasma atomic layer deposition method.

As described above, since the thickness of the protection film PF can be reduced when the protection film PF is formed by the plasma atomic layer deposition method, it is also effective to apply the protection film PF formed by the plasma atomic layer deposition method to the configuration in which the display unit DU is formed over the flexible substrate or the like.

Figure 9:
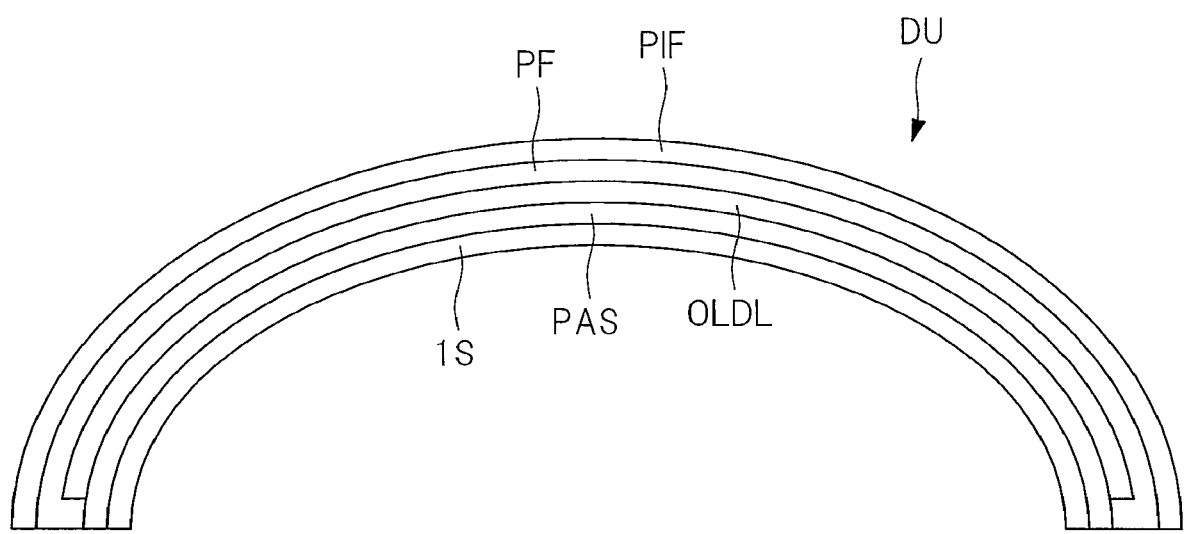

FIG. 9 is a diagram schematically showing a state in which a flexible substrate 1S is used as the substrate of the display unit DU and this flexible substrate 1S is bent. FIG. 9 shows a bending state of the display unit DU in which the passivation film PAS is formed over the flexible substrate 1S, an organic EL layer OLDL is formed over the passivation film PAS, the protection film PF is formed over the organic EL layer OLDL, and the resin film PIF is formed over the protection film PF. It can be seen that the display unit DU can be bent by forming the display unit DU over the flexible substrate 1S as described above. When the flexible substrate 1S is used as the substrate, there is a risk that cracks may occur in the protection film PF made of an inorganic insulating film when it is bent. Therefore, the protection film PF made of an inorganic insulating film is desirably made as thin as possible.

In this respect, when the flexible substrate 1S is used as the substrate, the thickness of the protection film PF can be reduced by adopting the protection film PF formed by using the plasma atomic layer deposition method. As a result, the protection film PF formed by the plasma atomic layer deposition method is useful in that it is possible to efficiently obtain the effect of preventing the entrance of moisture by the protection film PF while suppressing the occurrence of cracks in the protection film PF made of an inorganic insulating film.

<Film-Forming Method of Protection Film by Plasma Atomic Layer Deposition Method>

Figure 10:
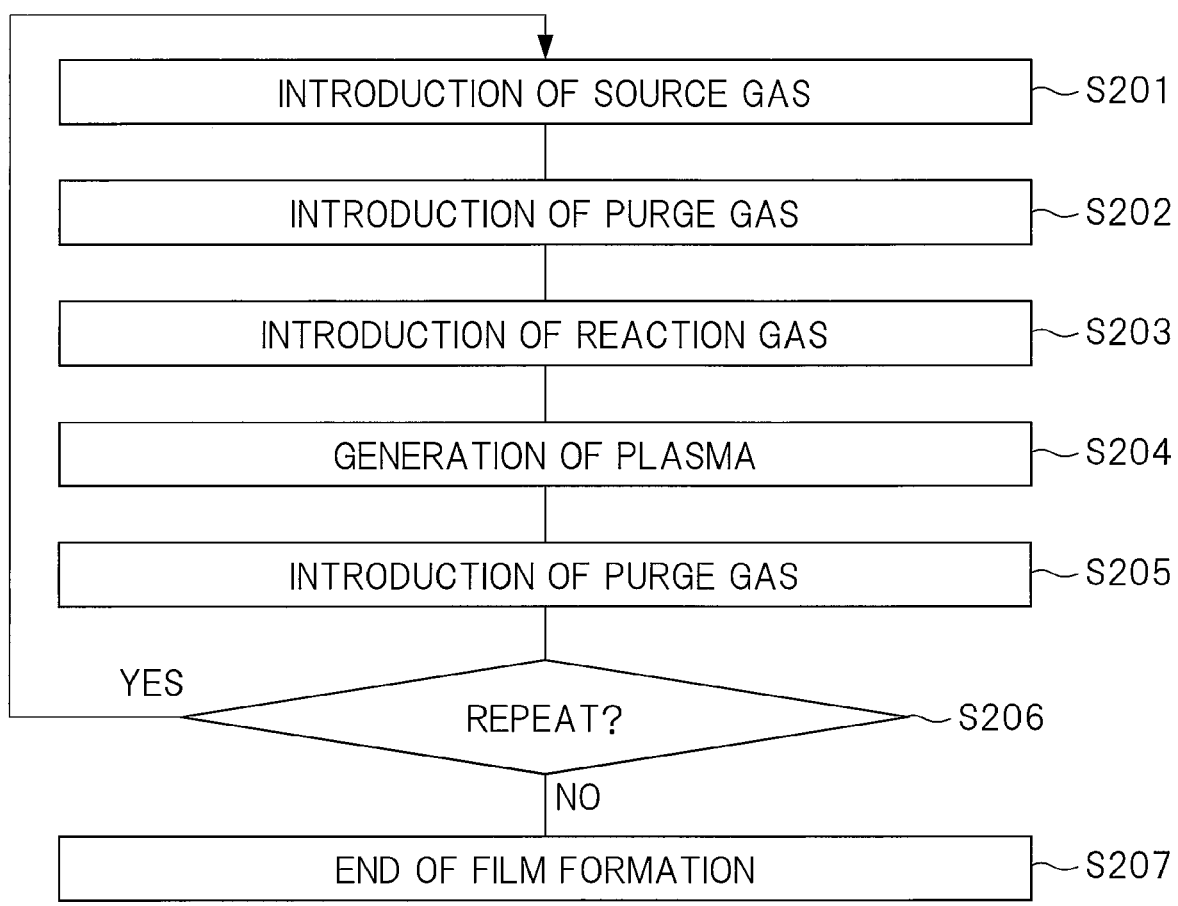

As described above, in order to effectively protect the organic EL element from the entrance of moisture while reducing the thickness of the protection film PF, it is useful to form the protection film by the plasma atomic layer deposition method. Thus, the forming method of the protection film by the plasma atomic layer deposition method will be described below. FIG. 10 is a flowchart for describing the forming method of the protection film by the plasma atomic layer deposition method.

First, the glass substrate is prepared, and the glass substrate is loaded over the lower electrode (stage) of the plasma atomic layer deposition apparatus. Subsequently, source gas is introduced into the film-forming container (process chamber) from a gas supply unit of the plasma atomic layer deposition apparatus (S201). At this time, the source gas is supplied into the film-forming container for, for example, 0.1 second. Consequently, the source gas is supplied into the film-forming container, and the source gas is adsorbed to the glass substrate and an adsorption layer is formed.

Subsequently, the supply of the source gas is stopped, and purge gas is introduced into the film-forming container (process chamber) from the gas supply unit (S202). Consequently, the purge gas is supplied into the film-forming container, and the source gas is exhausted to the outside of the film-forming container from an exhaust unit. The purge gas is supplied into the film-forming container for, for example, 0.1 second. Then, the exhaust unit exhausts the source gas and the purge gas in the film-forming container for, for example, 2 seconds. Consequently, the purge gas is supplied into the film-forming container and the source gas which is not adsorbed to the glass substrate is purged from the film-forming container.

Next, reaction gas is supplied from the gas supply unit (S203). Consequently, the reaction gas is supplied into the film-forming container. The reaction gas is supplied into the film-forming container for, for example, 1 second. In the step of supplying the reaction gas, plasma discharge is generated by applying a discharge voltage between the upper electrode and the lower electrode (S204). As a result, radicals (active species) are generated in the reaction gas. In the manner described above, the reaction gas is supplied into the film-forming container and the adsorption layer adsorbed to the glass substrate chemically reacts with the reaction gas, so that the protection film made of an atomic layer is formed.

Subsequently, the supply of the reaction gas is stopped, and purge gas is supplied from the gas supply unit (S205). Consequently, the purge gas is supplied into the film-forming container, and the reaction gas is exhausted to the outside of the film-forming container from the exhaust unit. The purge gas is supplied into the film-forming container for, for example, 0.1 second. Then, the exhaust unit exhausts the reaction gas and the purge gas in the film-forming container for, for example, 2 seconds. Consequently, the purge gas is supplied into the film-forming container, and the excessive reaction gas which is not used for the reaction is purged from the film-forming container.

In the manner described above, the protection film made of one atomic layer is formed over the glass substrate. Thereafter, by repeating the above-described steps (S201 to S205) a predetermined number of times (S206), the protection film made of a plurality of atomic layers is formed. Consequently, the film-forming process is completed (S207). In the manner described above, the protection film PF can be formed by the plasma atomic layer deposition method.

<Study for Improvement>

As described above, the protection film that protects the organic EL element from the entrance of moisture can be formed by the plasma atomic layer deposition method using the mask having the opening region corresponding to the display unit and the cover region corresponding to the frame region.

At this time, the study by the inventors of the present invention has newly revealed that there is a room for improvement in the process of forming the protection film by the plasma atomic layer deposition method using the mask having the opening region corresponding to the display unit and the cover region corresponding to the frame region. Thus, a "related technology 1" having the room for improvement will be described below with reference to the drawings.

<<Assumptions>>

First, as described in the paragraph of "<Necessity of Mask in Formation of Protection Film>", the mask MSK is necessary when forming the protection film, and the mask MSK has substantially the same size as the glass substrate GS as shown in FIG. 6. This is because the protection film needs to be formed at a time over all of the regions of the glass substrate GS corresponding to the plurality of display units DU, and all of the regions to be the frame regions (regions other than the plurality of display units DU) need to be covered so as not to form the protection film in all of the frame regions when forming the protection film. Incidentally, in recent years, from the viewpoint of improving the manufacturing efficiency, the size of the glass substrate GS has been increasing in order to increase the number of display units DU acquired from one glass substrate GS. This means that the size of the mask MSK having substantially the same size as the glass substrate GS is also increased. Also, the increase in size of the mask MSK leads to the situation in which it is difficult to ensure the flatness of the mask MSK. This is because the weight of the mask MSK itself increases due to the increase in size of the mask MSK and the deflection is thus likely to occur in the mask MSK, making it difficult to ensure the flatness of the mask MSK. Then, due to the decrease in the flatness of the mask MSK, the room for improvement becomes more apparent. Hereinafter, the room for improvement present in the "related technology 1" taken as an example will be described below with reference to the drawings.

<<Description of Related Technology 1>>

Figure 11:
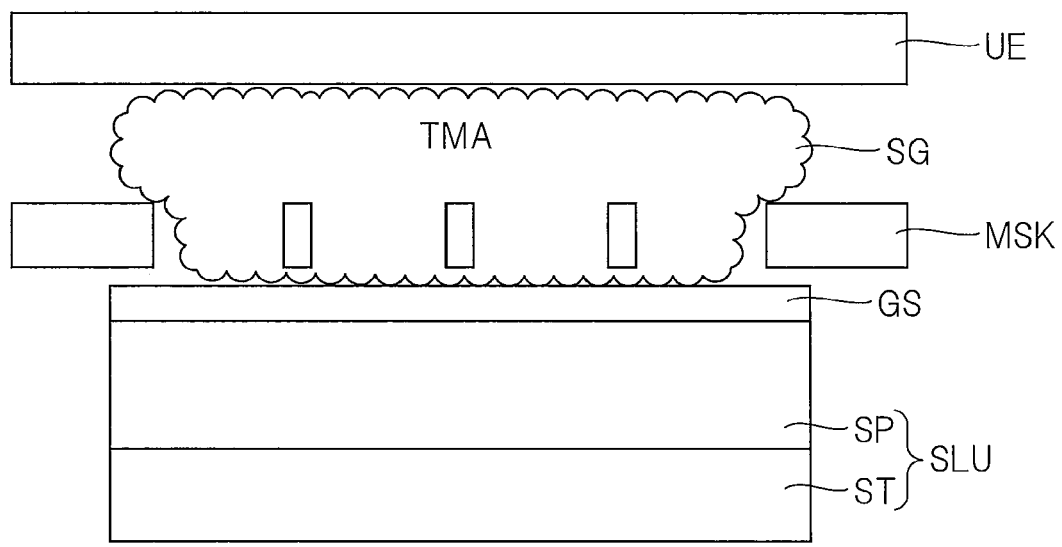

FIG. 11 is a schematic diagram showing a state in which source gas is introduced into a process chamber of a plasma atomic layer deposition apparatus in the related technology 1. In FIG. 11, a substrate loading unit SLU is provided in the process chamber in the related technology 1. This substrate loading unit SLU includes a stage ST and a susceptor SP disposed over the stage ST, and the glass substrate GS having the organic EL element formed therein is loaded over the susceptor SP.

Also, as shown in FIG. 11, the mask MSK is disposed over the glass substrate GS. At this time, the planar size of the mask MSK is increased so as to correspond to the large glass substrate GS, and the flatness of the mask MSK is decreased. As a result, as shown in FIG. 11, a minute gap is present between the glass substrate GS and the mask MSK in the related technology 1.

Further, in the process chamber, the upper electrode UE is disposed at the position facing the mask MSK, and the space sandwiched between the mask MSK and the upper electrode UE serves as the film-forming space. Also, the source gas SG is introduced into the film-forming space from the gas supply unit (not shown). The source gas SG is made of, for example, trimethyl aluminum (TMA). Further, the source gas SG enters the minute gap between the glass substrate GS and the mask MSK. Note that, at the stage shown in FIG. 11, no high frequency voltage is applied to the upper electrode UE, and no plasma is generated in the film-forming space.

Figure 12:
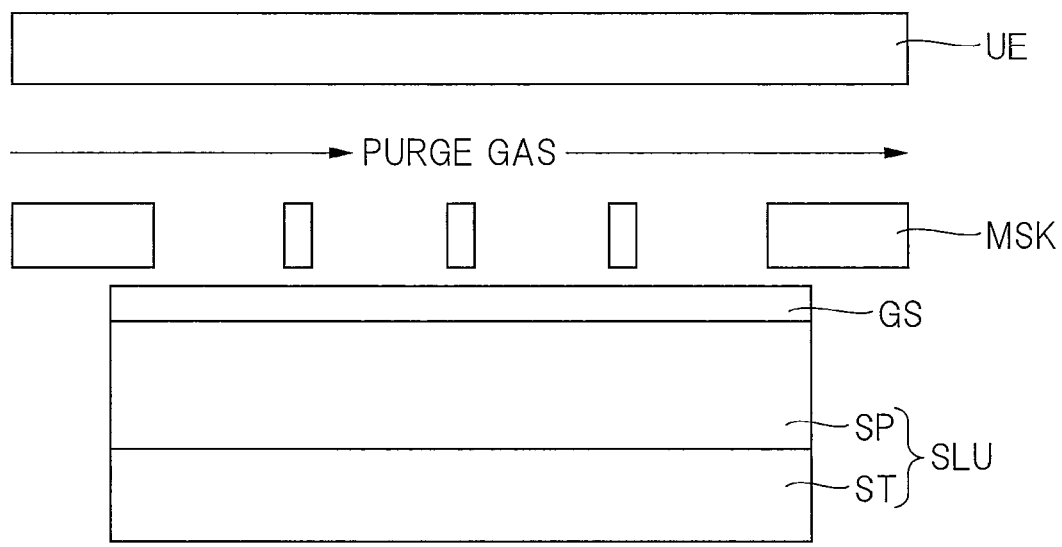
FIG. 12 is a schematic diagram showing a state in which purge gas is introduced into the process chamber of the plasma atomic layer deposition apparatus in the related technology 1.

Next, FIG. 12 is a schematic diagram showing a state in which purge gas is introduced into the process chamber of the plasma atomic layer deposition apparatus in the related technology 1. At this time, purge gas made of, for example, nitrogen gas is supplied into the process chamber from the gas supply unit (not shown). Consequently, the source gas SG remaining in the process space is exhausted from the process space. Even at this stage, the minute gap is still present between the mask MSK and the glass substrate GS. Note that, even at the stage shown in FIG. 12, no high frequency voltage is applied to the upper electrode UE, and no plasma is generated in the film-forming space.

Figure 13:
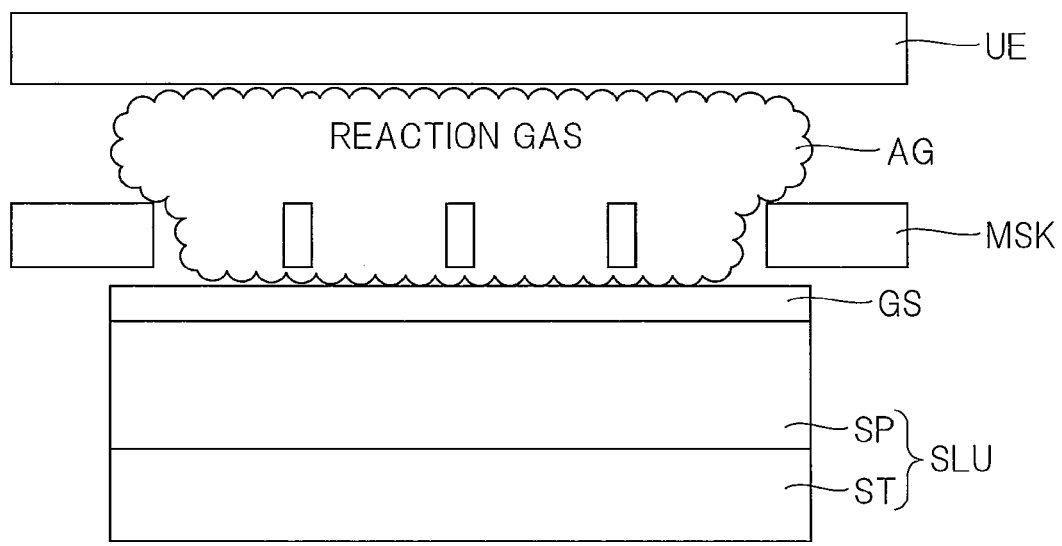
FIG. 13 is a schematic diagram showing a state in which reaction gas is introduced into the process chamber of the plasma atomic layer deposition apparatus in the related technology 1.

Subsequently, FIG. 13 is a schematic diagram showing a state in which reaction gas is introduced into the process chamber of the plasma atomic layer deposition apparatus in the related technology 1. At this time, reaction gas AG made of, for example, oxygen gas is supplied into the process chamber from the gas supply unit (not shown). Even at this stage, the minute gap is still present between the mask MSK and the glass substrate GS, and the reaction gas AG is supplied also to the minute gap in the related technology 1. Note that, even at the stage shown in FIG. 13, no high frequency voltage is applied to the upper electrode UE, and no plasma is generated in the film-forming space.

Figure 14:
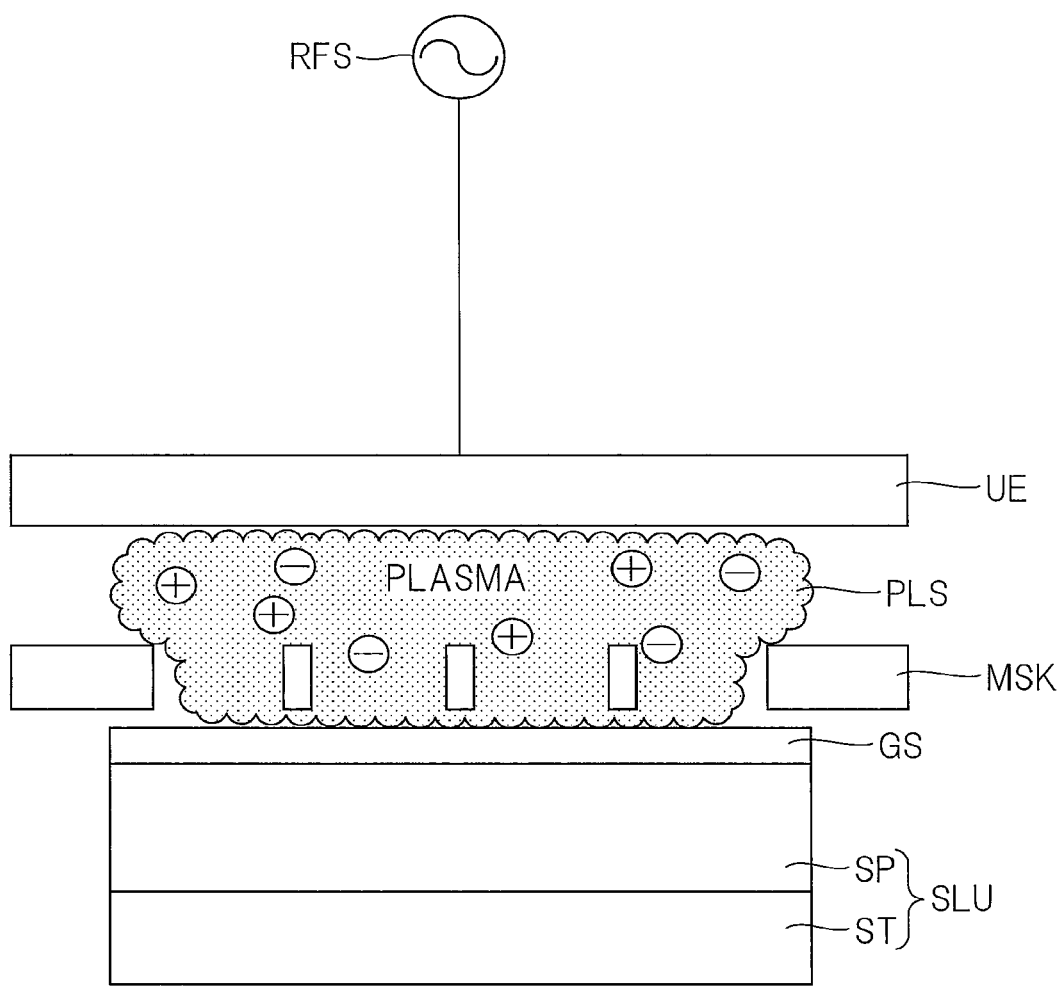
FIG. 14 is a schematic diagram showing a state in which plasma is generated in the process chamber of the plasma atomic layer deposition apparatus in the related technology 1.

Next, FIG. 14 is a schematic diagram showing a state in which plasma is generated in the process chamber of the plasma atomic layer deposition apparatus in the related technology 1. At this time, the reaction gas AG made of, for example, oxygen gas is supplied into the process chamber from the gas supply unit (not shown). Even at this stage, the minute gap is still present between the mask MSK and the glass substrate GS, and the reaction gas AG is supplied also to the minute gap in the related technology 1. Here, at the stage shown in FIG. 14, the high frequency voltage is applied to the upper electrode UE from a high frequency power source RFS. Consequently, plasma PLS containing radicals (active species) and charged particles is generated in the film-forming space. Then, by this plasma PLS, the adsorption layer formed over the glass substrate GS by introducing the source gas SG reacts with the reaction gas AG converted into plasma, and the protection film made of, for example, an aluminum oxide film is formed so as to cover the organic EL element formed in the glass substrate GS.

Figure 15:
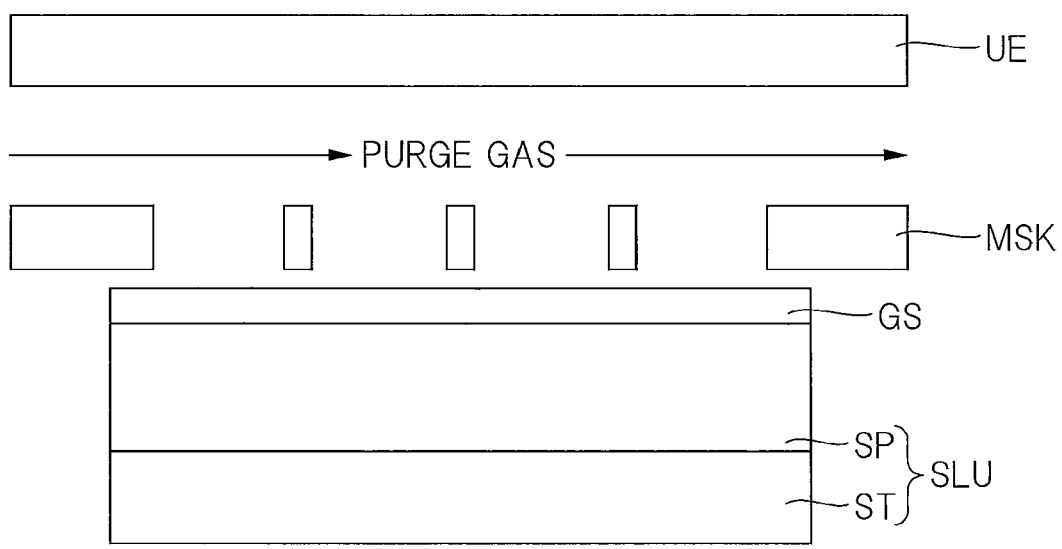
FIG. 15 is a schematic diagram showing a state in which purge gas is introduced into the process chamber of the plasma atomic layer deposition apparatus in the related technology 1.

Subsequently, FIG. 15 is a schematic diagram showing a state in which purge gas is introduced into the process chamber of the plasma atomic layer deposition apparatus in the related technology 1. At this time, purge gas made of, for example, nitrogen gas is supplied into the process chamber from the gas supply unit (not shown). Consequently, the reaction gas AG remaining in the process space is exhausted from the process space. Even at this stage, the minute gap is still present between the mask MSK and the glass substrate GS. Note that, at the stage shown in FIG. 15, the application of the high frequency voltage to the upper electrode UE is stopped. As a result, the plasma PLS generated in the film-forming space disappears.

In the manner described above, in the related technology 1, the protection film made of, for example, an aluminum oxide film can be formed so as to cover the organic EL element formed in the glass substrate GS by the plasma atomic layer deposition method using the mask MSK.

<<Description of Room for Improvement>>

Figure 16:
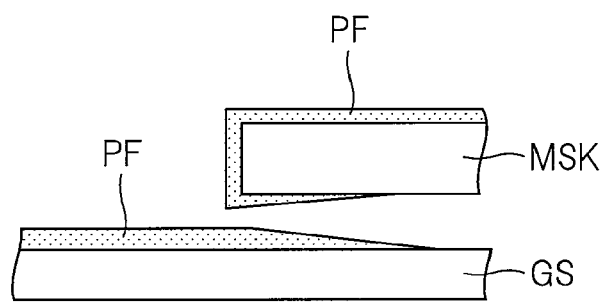
FIG. 16 is a diagram schematically showing a state in which a protection film is formed so as to enter a minute gap between a glass substrate and a mask.

Subsequently, the room for improvement present in the related technology 1 will be described. In the related technology 1, the mask having the opening region corresponding to the display unit and the cover region corresponding to the frame region is used, and it is thus conceived that the protection film is not formed in the frame region of the glass substrate. However, in the related technology 1, since (1) the minute gap is present between the mask and the glass substrate and (2) the forming method of the protection film is the plasma atomic layer deposition method, the protection film is formed also in a part of the frame region of the glass substrate. For example, FIG. 16 is a diagram schematically showing a state in which the protection film is formed so as to enter the minute gap between the glass substrate GS and the mask MSK. In this case, the electrode electrically connected to the display unit is formed in the frame region present below the mask MSK, and when the protection film made of an insulating material is formed over the electrode, the conduction between the display unit and the circuit unit through the electrode cannot be ensured.

Namely, since it becomes difficult to ensure the flatness of the mask with the increase in size of the mask, the minute gap is present between the mask and the glass substrate. Further, in the plasma atomic layer deposition method used to form the protection film, in order to achieve preferable step coverage, a material that easily diffuses is used as the source gas, and each gas (source gas, purge gas, and reaction gas) is alternately supplied while securing the time for sufficiently diffusing each gas in the film-forming container. Therefore, for example, the source gas and the reaction gas spread not only to the substrate but also in every corner of the film-forming container. Also, in the plasma atomic layer deposition apparatus, the film is formed by generating active species (radicals) by the plasma discharge in the reaction gas and reacting the active species with the source gas adsorbed to the substrate, and in addition, the source gas and the reaction gas tend to react with each other even in a state where the active species (radicals) are not generated by plasma discharge. Therefore, in the plasma atomic layer deposition apparatus, the source gas and the reaction gas react with each other to form the film even in the minute gap in which the plasma discharge is not generated. In other words, since the atomic layer deposition apparatus has the characteristics of (1) the film is formed in a unit of atomic layer, (2) the source gas and the reaction gas spread in every corner of the film-forming container, and (3) the source gas and the reaction gas easily react even in the place where the plasma discharge is not generated, the film is formed even in the minute gap formed between the mask and the glass substrate.

Figure 17:
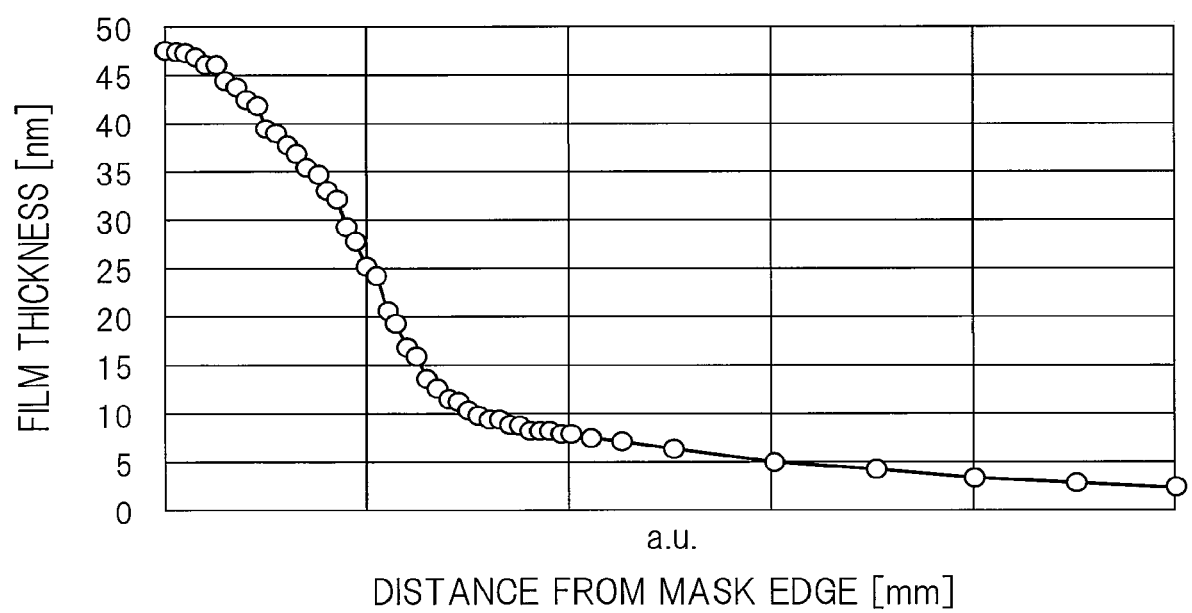
FIG. 17 is a graph showing a relationship between a distance of entrance from a mask edge toward the mask and a thickness of the formed protection film in the related technology 1.

FIG. 17 is a graph showing a relationship between a distance of entrance from a mask edge toward the mask and a thickness of the formed protection film. In FIG. 17, the horizontal axis represents the distance (mm) of entrance from the mask edge toward the mask, and the vertical axis represents the thickness (nm) of the formed protection film. As can be seen from FIG. 17, the protection film is formed even at the position entered from the mask edge toward the mask. Namely, according to the measurement results shown in FIG. 17, it can be seen that the protection film is formed also in a part of the frame region of the glass substrate that is supposed to be covered with the mask in the related technology 1. Incidentally, in the mobile phone (smartphone), it is desired that the size of the display unit is increased and the size of the frame region is reduced as much as possible. This is because it is desired that the overall size of the mobile phone is reduced while ensuring the size of the display unit in the mobile phone (smartphone). In this respect, when the size of the frame region is reduced in the related technology 1, there is a high possibility that the protection film is formed so as to cover the electrode formed in the frame region due to the entrance of the protection film. In this case, there is a concern that the conduction between the display unit and the circuit unit through the electrode cannot be ensured. On the other hand, when the frame region is configured to have a larger size to form the electrode in an inner region where the entrance of the protection film does not occur, the size of the frame region is increased, so that the overall size of the mobile phone is increased even though the size of the display unit is not increased. Accordingly, it can be seen that there is a room for improvement from the viewpoint of ensuring the electrical connection reliability between the display unit and the circuit unit through the electrode formed in the frame region while reducing the size of the frame region in the related technology 1.

Here, since the main cause of the entrance of the protection film into the frame region is the formation of the minute gap between the glass substrate and the mask, the elimination of the minute gap is considered. In particular, since the minute gap is caused by the decrease in the flatness of the mask, it is conceivable to eliminate the gap by the selection of the mask material constituting the mask. For example, when the mask material is made of metal, the distance of entrance of the protection film is about 3 mm. On the other hand, when the mask material is made of ceramic, the distance of entrance of the protection film is about 1 mm. Accordingly, it seems that the entrance of the protection film into the frame region can be suppressed by changing the mask material from metal to ceramic. However, even when the mask material is changed to ceramic, the decrease in the flatness of the mask cannot be completely solved, and in particular, there is a concern that the entrance of the protection film into the frame region expands due to the increase in size of the mask even when the mask is made of ceramic. As described above, changing the mask material in order to suppress the entrance of the protection film into the frame region is not an essential measure, and a further fundamental measure is needed.

Thus, in a related technology 2, a contrivance of making the mask from a magnetic substance and forcibly attracting the mask to the glass substrate by the magnetic force of the magnet provided outside is applied for suppressing the formation of the minute gap between the glass substrate and the mask to be the main cause of the entrance of the protection film into the frame region. Hereinafter, the related technology 2 to which the contrivance is applied will be described.

<Description of Related Technology 2>

Figure 18:
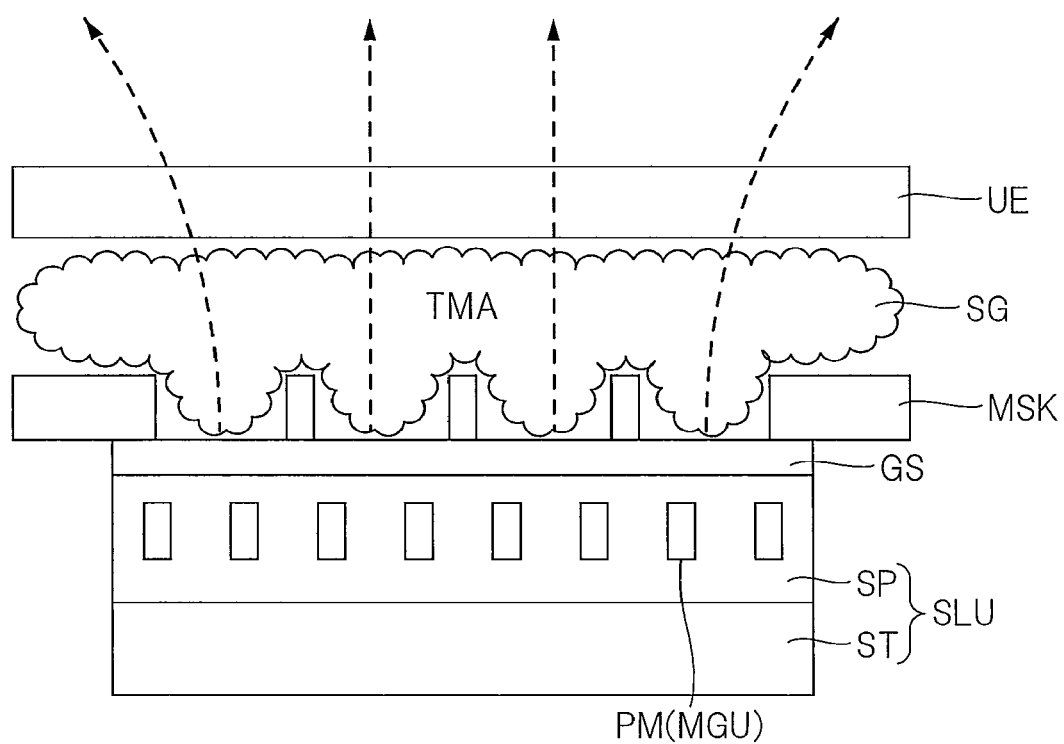
FIG. 18 is a schematic diagram showing a state in which source gas is introduced into a process chamber of a plasma atomic layer deposition apparatus in a related technology 2.

FIG. 18 is a schematic diagram showing a state in which source gas is introduced into a process chamber of a plasma atomic layer deposition apparatus in the related technology 2. In FIG. 18, a substrate loading unit SLU is provided in the process chamber in the related technology 2. This substrate loading unit SLU includes a stage ST and a susceptor SP disposed over the stage ST, and a permanent magnet PM functioning as a magnetic field generating unit MGU is embedded in the susceptor SP. Further, the glass substrate GS having the organic EL element formed therein is loaded over the susceptor SP. Also, as shown in FIG. 18, the mask MSK made of a magnetic substance is disposed over the glass substrate GS. Therefore, in the related technology 2, since the mask MSK made of a magnetic substance is attracted to the permanent magnet PM, the minute gap is not present between the mask MSK and the glass substrate GS.

Further, in the process chamber, the upper electrode UE is disposed at the position facing the mask MSK, and the space sandwiched between the mask MSK and the upper electrode UE serves as the film-forming space. Also, the source gas SG is introduced into the film-forming space from the gas supply unit (not shown). The source gas SG is made of, for example, trimethyl aluminum (TMA). At this time, since the minute gap is not present between the mask MSK and the glass substrate GS in the related technology 2, the source gas SG does not enter between the glass substrate GS and the mask MSK. Note that, at the stage shown in FIG. 18, no high frequency voltage is applied to the upper electrode UE, and no plasma is generated in the film-forming space.

Figure 19:
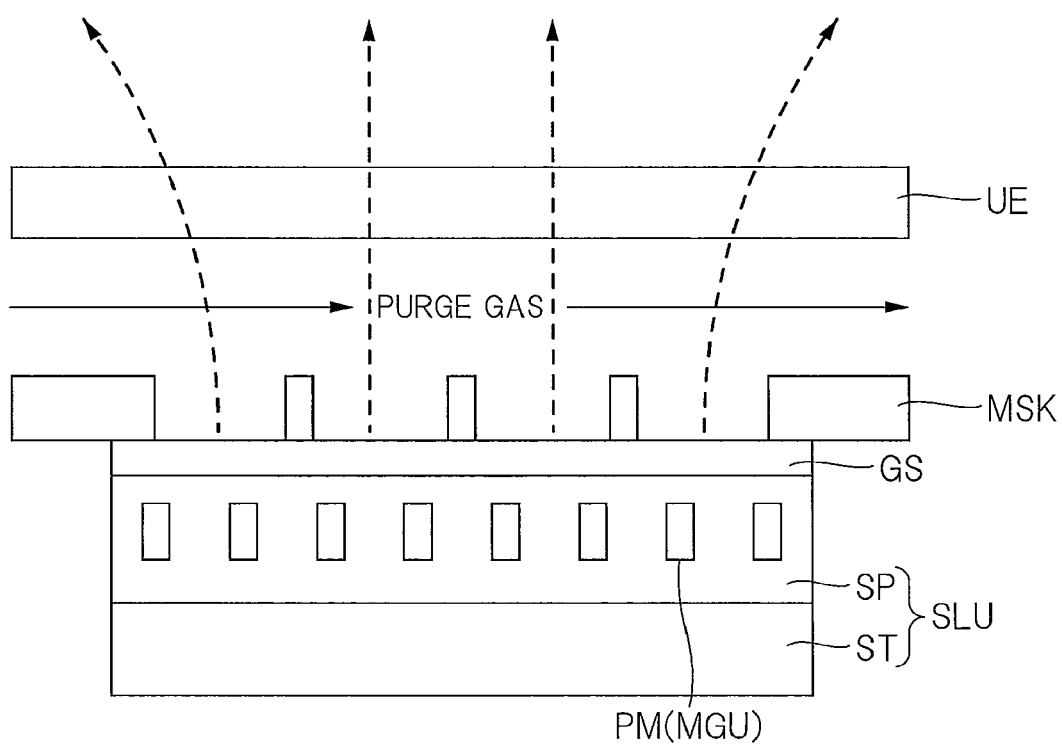
FIG. 19 is a schematic diagram showing a state in which purge gas is introduced into the process chamber of the plasma atomic layer deposition apparatus in the related technology 2.

Next, FIG. 19 is a schematic diagram showing a state in which purge gas is introduced into the process chamber of the plasma atomic layer deposition apparatus in the related technology 2. At this time, purge gas made of, for example, nitrogen gas is supplied into the process chamber from the gas supply unit (not shown). Consequently, the source gas SG remaining in the process space is exhausted from the process space. Even at this stage, since the mask MSK made of a magnetic substance is still attracted to the permanent magnet PM, the minute gap is not present between the mask MSK and the glass substrate GS. Note that, even at the stage shown in FIG. 19, no high frequency voltage is applied to the upper electrode UE, and no plasma is generated in the film-forming space.

Figure 20:
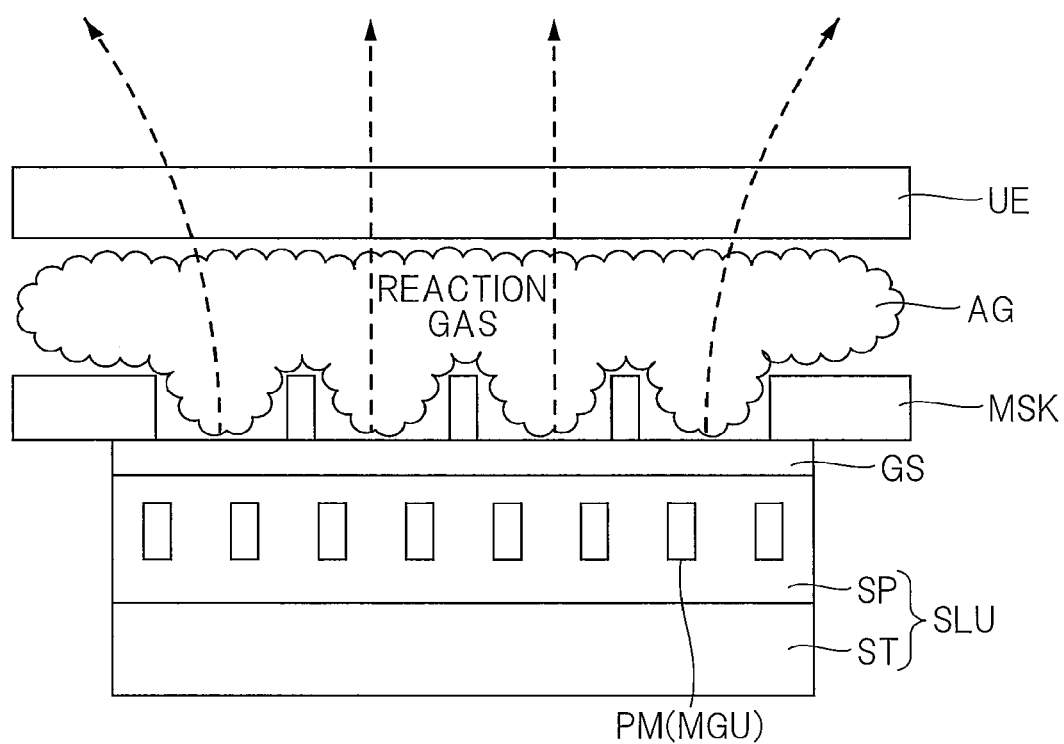
FIG. 20 is a schematic diagram showing a state in which reaction gas is introduced into the process chamber of the plasma atomic layer deposition apparatus in the related technology 2.

Subsequently, FIG. 20 is a schematic diagram showing a state in which reaction gas is introduced into the process chamber of the plasma atomic layer deposition apparatus in the related technology 2. At this time, reaction gas AG made of, for example, oxygen gas is supplied into the process chamber from the gas supply unit (not shown). Even at this stage, since the mask MSK made of a magnetic substance is attracted to the permanent magnet PM, the minute gap is not present between the mask MSK and the glass substrate GS. Accordingly, the reaction gas AG does not enter between the glass substrate GS and the mask MSK. Note that, even at the stage shown in FIG. 20, no high frequency voltage is applied to the upper electrode UE, and no plasma is generated in the film-forming space.

Figure 21:
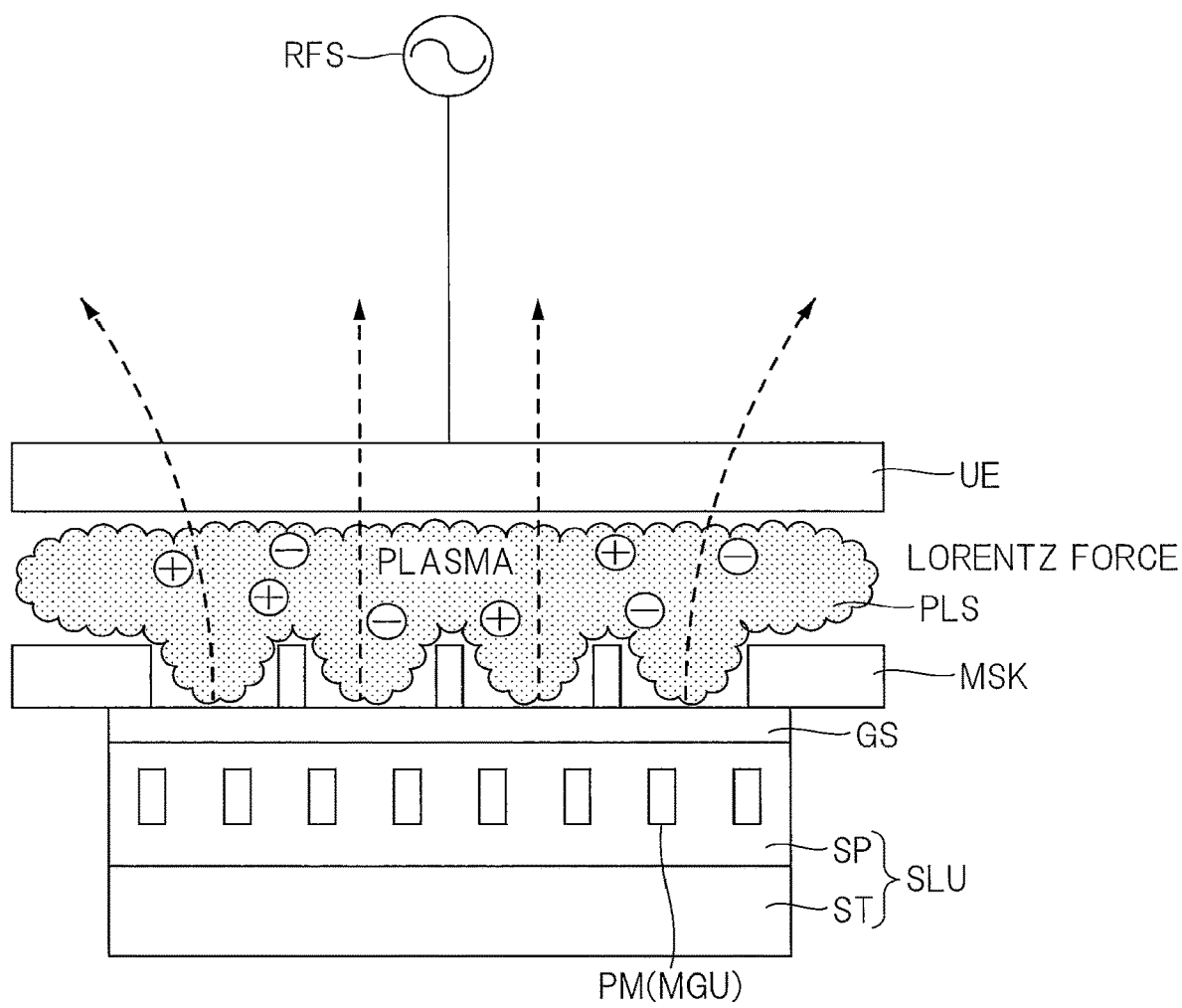
FIG. 21 is a schematic diagram showing a state in which plasma is generated in the process chamber of the plasma atomic layer deposition apparatus in the related technology 2.

Next, FIG. 21 is a schematic diagram showing a state in which plasma is generated in the process chamber of the plasma atomic layer deposition apparatus in the related technology 2. At this time, the reaction gas AG made of, for example, oxygen gas is supplied into the process chamber from the gas supply unit (not shown). Even at this stage, since the mask MSK made of a magnetic substance is still attracted to the permanent magnet PM, the minute gap is not present between the mask MSK and the glass substrate GS. Accordingly, the reaction gas AG does not enter between the glass substrate GS and the mask MSK.

Here, at the stage shown in FIG. 21, the high frequency voltage is applied to the upper electrode UE from a high frequency power source RFS. Consequently, plasma PLS containing radicals (active species) and charged particles is generated in the film-forming space. Then, by this plasma PLS, the adsorption layer formed over the glass substrate GS by introducing the source gas SG reacts with the reaction gas AG converted into plasma, and the protection film made of, for example, an aluminum oxide film is formed so as to cover the organic EL element formed in the glass substrate GS.

Figure 22:
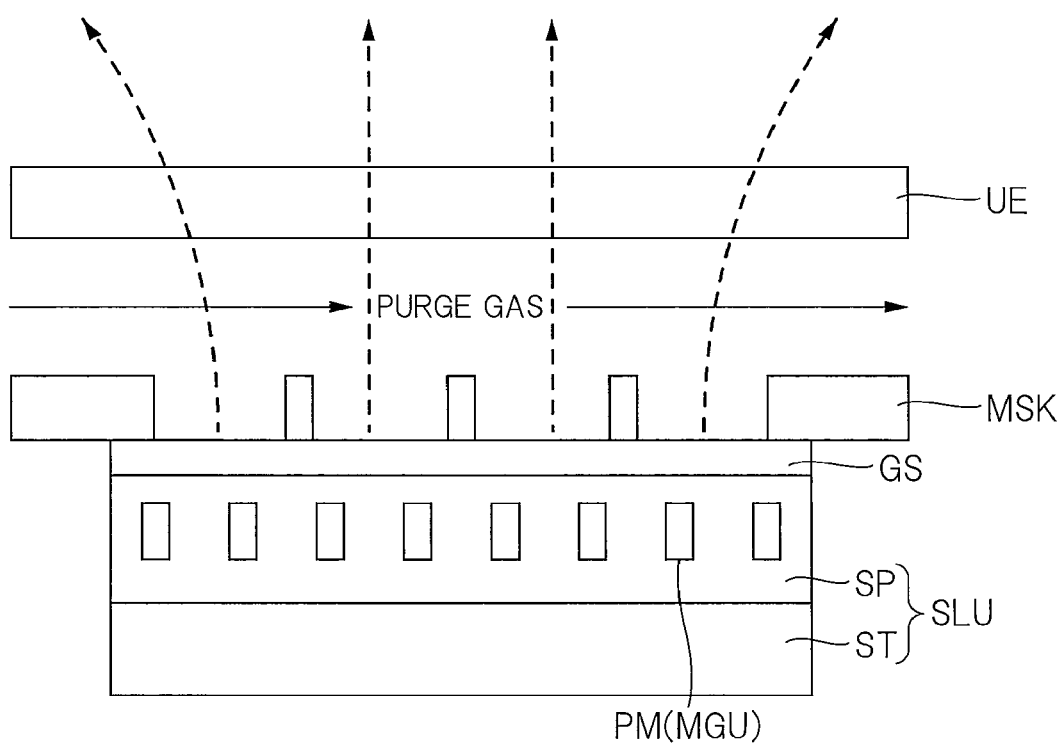
FIG. 22 is a schematic diagram showing a state in which purge gas is introduced into the process chamber of the plasma atomic layer deposition apparatus in the related technology 2.

Subsequently, FIG. 22 is a schematic diagram showing a state in which purge gas is introduced into the process chamber of the plasma atomic layer deposition apparatus in the related technology 2. At this time, purge gas made of, for example, nitrogen gas is supplied into the process chamber from the gas supply unit (not shown). Consequently, the reaction gas AG remaining in the process space is exhausted from the process space. Even at this stage, since the mask MSK made of a magnetic substance is still attracted to the permanent magnet PM, the minute gap is not present between the mask MSK and the glass substrate GS. Note that, at the stage shown in FIG. 22, the application of the high frequency voltage to the upper electrode UE is stopped. As a result, the plasma PLS generated in the film-forming space disappears.

In the manner described above, in the related technology 2, the protection film made of, for example, an aluminum oxide film can be formed so as to cover the organic EL element formed in the glass substrate GS by the plasma atomic layer deposition method using the mask MSK.

<Room for Improvement Specific to Related Technology 2>

In the related technology 2 described above, as shown in FIGS. 18 to 22, since the mask MSK made of a magnetic substance is attracted to the permanent magnet PM during the film-forming operation, the minute gap is not present between the mask MSK and the glass substrate GS. Accordingly, in the related technology 2, the entrance of the protection film into the frame region covered with the mask MSK can be prevented. In other words, since the adhesion between the mask MSK made of a magnetic substance and the glass substrate GS can be improved by the magnetic force based on the magnetic field generated from the permanent magnet PM in the related technology 2, the formation of the protection film in the frame region can be suppressed.

However, in the related technology 2, for example, as shown in FIG. 21, the magnetic field from the permanent magnet PM embedded in the susceptor SP leaks to the film-forming space even in the state in which the plasma PLS is generated. Accordingly, the plasma PLS generated in the film-forming space is affected by the magnetic field. Also, since the plasma PLS contains the charged particles, the Lorentz force acts on the charged particles, so that the film thickness distribution of the protection film formed over the glass substrate GS is disturbed.

As described above, in the related technology 2, by making the mask MSK from a magnetic substance and embedding the permanent magnet PM in the substrate loading unit SLU, the mask MSK is forcibly attracted to the glass substrate GS by the magnetic force from the permanent magnet PM, so that the formation of the minute gap between the glass substrate GS and the mask MSK to be the main cause of the entrance of the protection film into the frame region can be suppressed. However, in the related technology 2, as a side effect of embedding the permanent magnet PM in the substrate loading unit SLU, the magnetic field from the permanent magnet PM reaches the plasma PLS even in the state where the plasma PLS is generated. Accordingly, the adverse effect of the magnetic field acts as the Lorentz force on the charged particles constituting the plasma PLS, resulting in the side effect that the film thickness distribution of the protection film formed over the glass substrate GS is disturbed. Namely, in the related technology 2, the formation of the minute gap between the glass substrate GS and the mask MSK can be suppressed by the use of magnetic force, whereas the adverse effect due to the magnetic field acts on the plasma PLS, resulting in the side effect of the disturbance in the film thickness distribution of the protection film formed over the glass substrate GS.

<<Inevitability of Use of Plasma>>

Here, as a measure of preventing the side effect of the disturbance in the film thickness distribution of the protection film due to the Lorentz force acting on the charged particles constituting the plasma by the magnetic field generated from the permanent magnet, it can be thought that the side effect may not be caused if the plasma is not used. Namely, it is conceivable that the side effect of the disturbance in the film thickness distribution of the protection film can be prevented without being adversely affected by the magnetic field generated from the permanent magnet when the atomic layer deposition method using no plasma is used as the film-forming method of forming the protection film instead of the plasma atomic layer deposition method using plasma.

In this respect, in particular, in the process of forming the protection film so as to cover the glass substrate having the organic EL element formed therein, there is an inevitability of using the plasma atomic layer deposition method. Namely, the organic EL element is weak at high temperature, and thus it is difficult to heat the glass substrate having the organic EL element formed therein to high temperature. Further, in order to form the high-quality protection film by the atomic layer deposition method using no plasma, it is necessary to set the film-forming temperature to a high temperature, and when the protection film is formed while setting the film-forming temperature to a low temperature inconsideration of the organic EL element, it is difficult to form the high-quality protection film. On the other hand, since plasma is used in the plasma atomic layer deposition method, the high-quality protection film can be formed even when the film-forming temperature is set to a low temperature that does not affect the organic EL element.

As described above, in the process of forming the protection film so as to cover the glass substrate having the organic EL element formed therein, there is an inevitability of using the plasma atomic layer deposition method. Namely, as a measure of preventing the side effect of the disturbance in the film thickness distribution of the protection film due to the Lorentz force acting on the charged particles constituting the plasma by the magnetic field generated from the permanent magnet, there is no room to select the atomic layer deposition method using no plasma. Therefore, in order to solve the side effect of the disturbance in the film thickness distribution of the protection film due to the Lorentz force acting on the charged particles constituting the plasma by the magnetic field generated from the permanent magnet, a further contrivance is required.

<<Difficulty in Applying Related Technology 2>>

In addition, in the related technology 2, a contrivance of making the mask from a magnetic substance and forcibly attracting the mask to the glass substrate by the magnetic force from the permanent magnet embedded in the substrate loading unit is applied for suppressing the formation of the minute gap between the glass substrate and the mask to be the main cause of the entrance of the protection film into the frame region. In this respect, it is difficult to actually apply the related technology 2 to the manufacturing process of the protection film that covers the glass substrate having the organic EL element formed therein.

This will be described below. For example, although the organic EL element is weak at high temperature, the film-forming temperature is about 80 to 100° C. when the protection film that covers the glass substrate having the organic EL element formed therein is formed by the plasma atomic layer deposition method. This means that the substrate loading unit in which the permanent magnet is embedded is also heated to about 80 to 100° C. This means that the temperature of about 80 to 100° C. is applied also to the permanent magnet embedded in the substrate loading unit.

Here, it is known that the permanent magnet loses the function as a magnet when it is heated to a high temperature. Therefore, it is difficult to apply the idea of making the mask from a magnetic substance and forcibly attracting the mask to the glass substrate by the magnetic force of the permanent magnet embedded in the substrate loading unit to the process of forming the protection film that covers the glass substrate having the organic EL element formed therein by the plasma atomic layer deposition method. This is because the permanent magnet is heated to a temperature of about 80 to 100° C. in this process, so that the permanent magnet becomes unable to exert the function as a magnet. Namely, although the idea of the related technology 2 seems useful from the viewpoint of suppressing the formation of the minute gap between the glass substrate and the mask to be the main cause of the entrance of the protection film into the frame region, it is difficult to actually apply the idea to the process of forming the protection film that covers the glass substrate having the organic EL element formed therein by the plasma atomic layer deposition method, and a further contrivance is required.

Thus, in this embodiment, while using the idea of the related technology 2 as a basic idea, a contrivance capable of being actually applied to the process of forming the protection film that covers the glass substrate having the organic EL element formed therein by the plasma atomic layer deposition method and capable of suppressing the side effect that appears in the related technology 2 is applied. The technological idea according to this embodiment to which this contrivance is applied will be described.

<Plasma Atomic Layer Deposition Apparatus>

Figure 23:
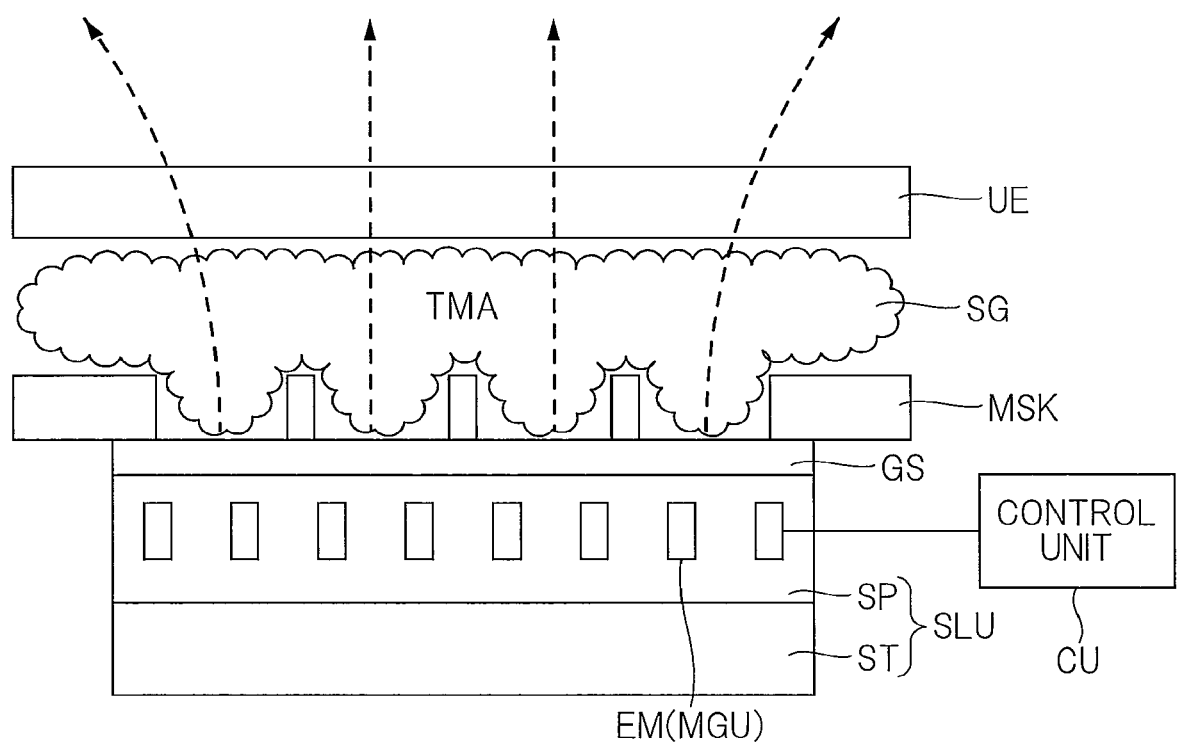
FIG. 23 is a diagram showing a schematic configuration in a process chamber of a plasma atomic layer deposition apparatus according to an embodiment and a state in which source gas is introduced into the process chamber.

FIG. 23 is a diagram showing a schematic configuration in a process chamber of a plasma atomic layer deposition apparatus according to this embodiment. In FIG. 23, the plasma atomic layer deposition apparatus according to this embodiment is configured to form a film over the glass substrate GS by using the mask MSK disposed over the glass substrate GS and made of a magnetic substance and the plasma generated above the glass substrate GS.

In particular, the plasma atomic layer deposition apparatus according to this embodiment is configured to form a protection film that protects an organic EL element. For example, the protection film that protects the organic EL element is made of an insulating film such as a silicon oxide film, a silicon nitride film, a silicon oxynitride film, an aluminum oxide film or an aluminum oxynitride film. Therefore, the plasma atomic layer deposition apparatus according to this embodiment includes a gas supply unit (not shown) connected to a process chamber, and can form various kinds of films typified by an aluminum oxide film and a silicon oxide film by changing source gas, reaction gas, and purge gas introduced into the process chamber from the gas supply unit.

Next, as shown in FIG. 23, the plasma atomic layer deposition apparatus according to this embodiment includes the substrate loading unit SLU over which the glass substrate GS is loaded, and the substrate loading unit SLU includes the stage ST and the susceptor SP disposed over the stage ST. Also, in the susceptor SP, the magnetic field generating unit MGU composed of an electromagnet EM is provided so as to be embedded in the susceptor SP. Then, the glass substrate GS is loaded over the susceptor SP.

Further, the plasma atomic layer deposition apparatus according to this embodiment includes the upper electrode UE provided above the substrate loading unit SLU, a high frequency power source unit (not shown in FIG. 23) connectable to the upper electrode UE, and a control unit CU electrically connected to the magnetic field generating unit MGU composed of the electromagnet EM. At this time, the control unit CU is configured to control the generation and stop of the magnetic field from the magnetic field generating unit MGU and to control the supply and stop of the high frequency voltage to the upper electrode UE. Also, the control unit CU is configured to be able to switch the generation and stop of the magnetic field from the magnetic field generating unit MGU during the film-forming operation.

In the plasma atomic layer deposition apparatus configured in the manner described above, the control unit CU is configured to be able to stop the generation of the magnetic field from the magnetic field generating unit MGU during the period when the plasma is generated. In other words, the control unit CU is configured to be able to stop the generation of the magnetic field from the magnetic field generating unit MGU during the period when the high frequency voltage is supplied to the upper electrode UE. In addition, the control unit CU is configured to be able to generate the magnetic field from the magnetic field generating unit MGU during the period when the supply of the high frequency voltage to the upper electrode UE is stopped.

<Film-Forming Method Using Plasma Atomic Layer Deposition Method>

In the manner described above, the plasma atomic layer deposition apparatus according to this embodiment is configured, and the film-forming method of forming the protection film that covers the glass substrate GS having the organic EL element formed therein by using the plasma atomic layer deposition apparatus thus configured will be described below.

FIG. 23 is a schematic diagram showing a state in which source gas is introduced into the process chamber of the plasma atomic layer deposition apparatus according to this embodiment. In FIG. 23, the substrate loading unit SLU is provided in the process chamber in this embodiment. This substrate loading unit SLU includes the stage ST and the susceptor SP disposed over the stage ST, and the electromagnet EM functioning as the magnetic field generating unit MGU is embedded in the susceptor SP. Further, the glass substrate GS having the organic EL element formed therein is loaded over the susceptor SP. Also, as shown in FIG. 23, the mask MSK made of a magnetic substance is disposed over the glass substrate GS. In addition, at the stage shown in FIG. 23, the control unit CU of the plasma atomic layer deposition apparatus according to this embodiment controls to allow a current to flow to the electromagnet EM. Consequently, the magnetic field is generated from the electromagnet EM, and the mask MSK made of a magnetic substance is attracted to the electromagnet EM by the magnetic force based on the magnetic field. As a result, the adhesion between the mask MSK and the glass substrate GS is improved, and the minute gap is not present between the mask MSK and the glass substrate GS.

Further, in the process chamber, the upper electrode UE is disposed at the position facing the mask MSK, and the space sandwiched between the mask MSK and the upper electrode UE serves as the film-forming space. At this time, at the stage shown in FIG. 23, the control unit CU of the plasma atomic layer deposition apparatus according to this embodiment controls so that the upper electrode UE and the high frequency power source are in a non-connected state. As a result, at the stage shown in FIG. 23, no high frequency voltage is applied to the upper electrode UE, and no plasma is generated in the film-forming space.

Further, the source gas SG is introduced into the film-forming space from the gas supply unit (not shown). The source gas is made of, for example, trimethyl aluminum (TMA). At this time, since the minute gap is not present between the mask MSK and the glass substrate GS in this embodiment, the source gas SG does not enter between the glass substrate GS and the mask MSK.

Figure 24:
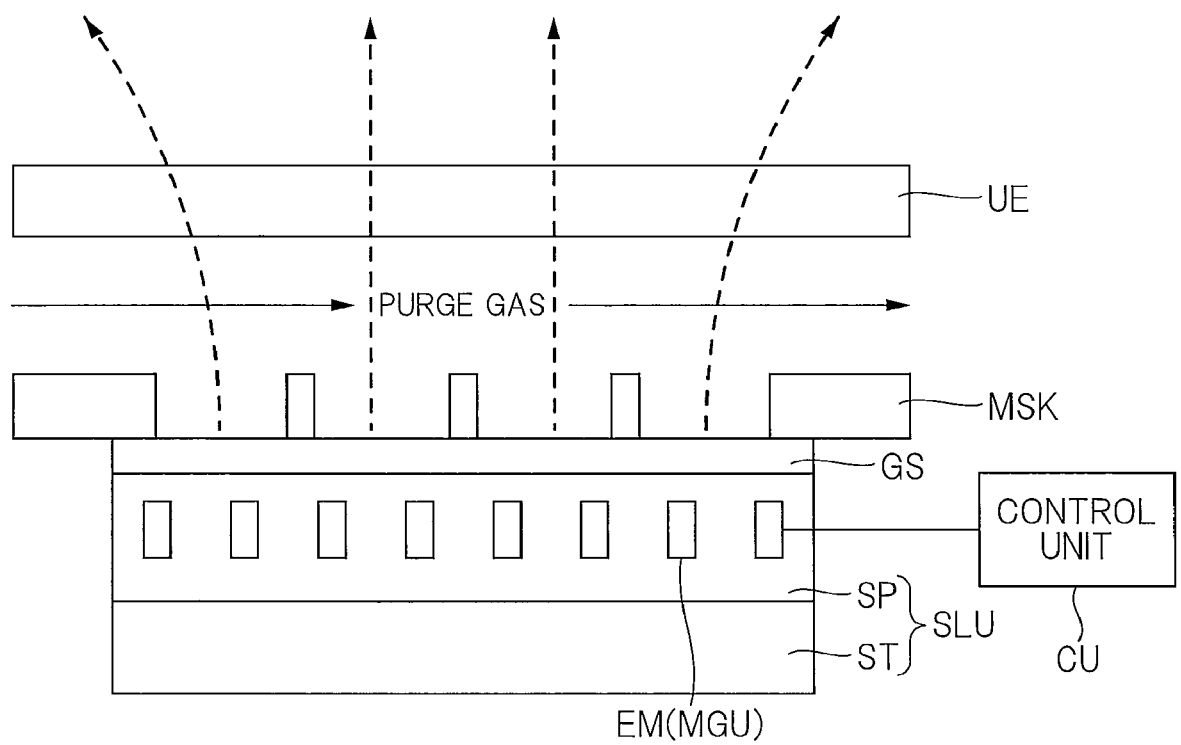
FIG. 24 is a schematic diagram showing a state in which purge gas is introduced into the process chamber of the plasma atomic layer deposition apparatus according to the embodiment.

Next, FIG. 24 is a schematic diagram showing a state in which purge gas is introduced into the process chamber of the plasma atomic layer deposition apparatus according to this embodiment. At this time, purge gas made of, for example, nitrogen gas is supplied into the process chamber from the gas supply unit (not shown). Consequently, the source gas SG remaining in the process space is exhausted from the process space. Even at this stage, the control unit CU controls so as to allow a current to flow to the electromagnet EM. Thus, the electromagnet EM continues to generate the magnetic field, and the state in which the mask MSK made of a magnetic substance is attracted to the electromagnet EM by the magnetic force based on the magnetic field is maintained. As a result, the adhesion between the mask MSK and the glass substrate GS is improved, and the minute gap is not present between the mask MSK and the glass substrate GS.

Note that, at the stage shown in FIG. 24, the control unit CU of the plasma atomic layer deposition apparatus according to this embodiment controls so that the upper electrode UE and the high frequency power source are in a non-connected state. As a result, at the stage shown in FIG. 24, no high frequency voltage is applied to the upper electrode UE, and no plasma is generated in the film-forming space.

Figure 25:
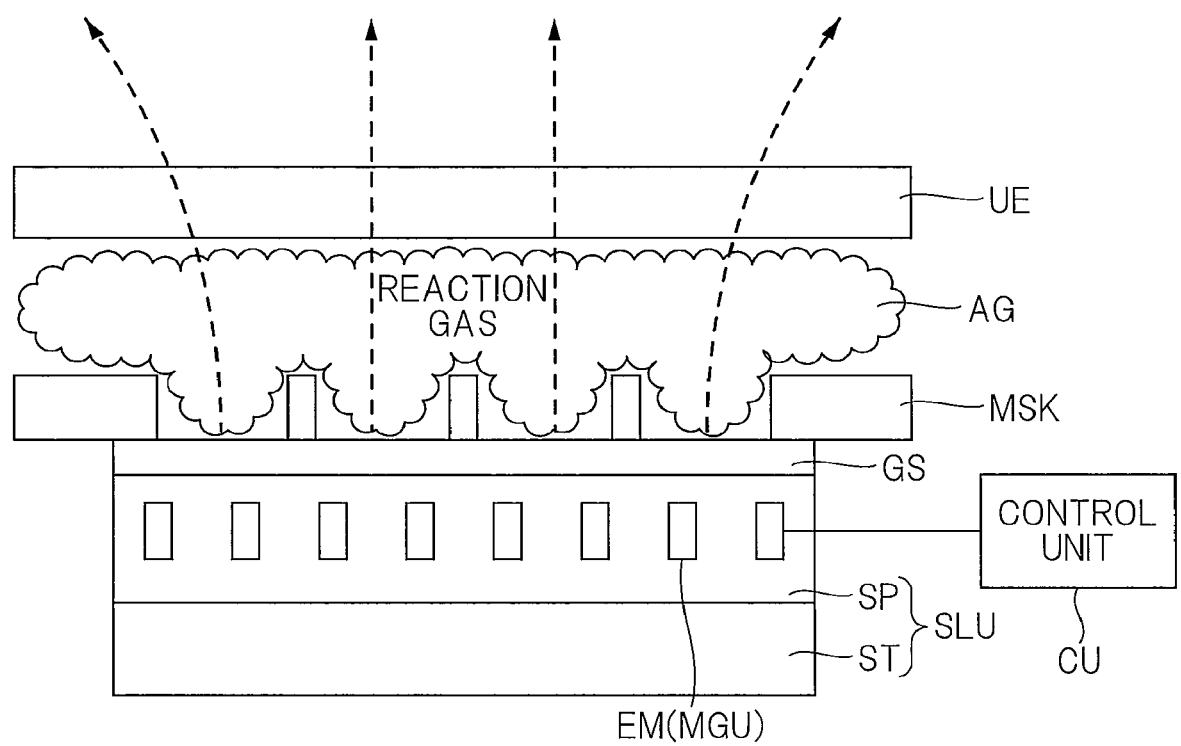
FIG. 25 is a schematic diagram showing a state in which reaction gas is introduced into the process chamber of the plasma atomic layer deposition apparatus according to the embodiment.

Subsequently, FIG. 25 is a schematic diagram showing a state in which reaction gas is introduced into the process chamber of the plasma atomic layer deposition apparatus according to this embodiment. At this time, the reaction gas AG made of, for example, oxygen gas is supplied into the process chamber from the gas supply unit (not shown). Even at this stage, the control unit CU still controls so as to allow a current to flow to the electromagnet EM. Thus, the electromagnet EM continues to generate the magnetic field, and the state in which the mask MSK made of a magnetic substance is attracted to the electromagnet EM by the magnetic force based on the magnetic field is maintained. As a result, the adhesion between the mask MSK and the glass substrate GS is improved, and the minute gap is not present between the mask MSK and the glass substrate GS. Note that, at the stage shown in FIG. 25, the control unit CU of the plasma atomic layer deposition apparatus according to this embodiment continues to control so that the upper electrode UE and the high frequency power source are in a non-connected state. As a result, at the stage shown in FIG. 25, no high frequency voltage is applied to the upper electrode UE, and no plasma is generated in the film-forming space.

Figure 26:
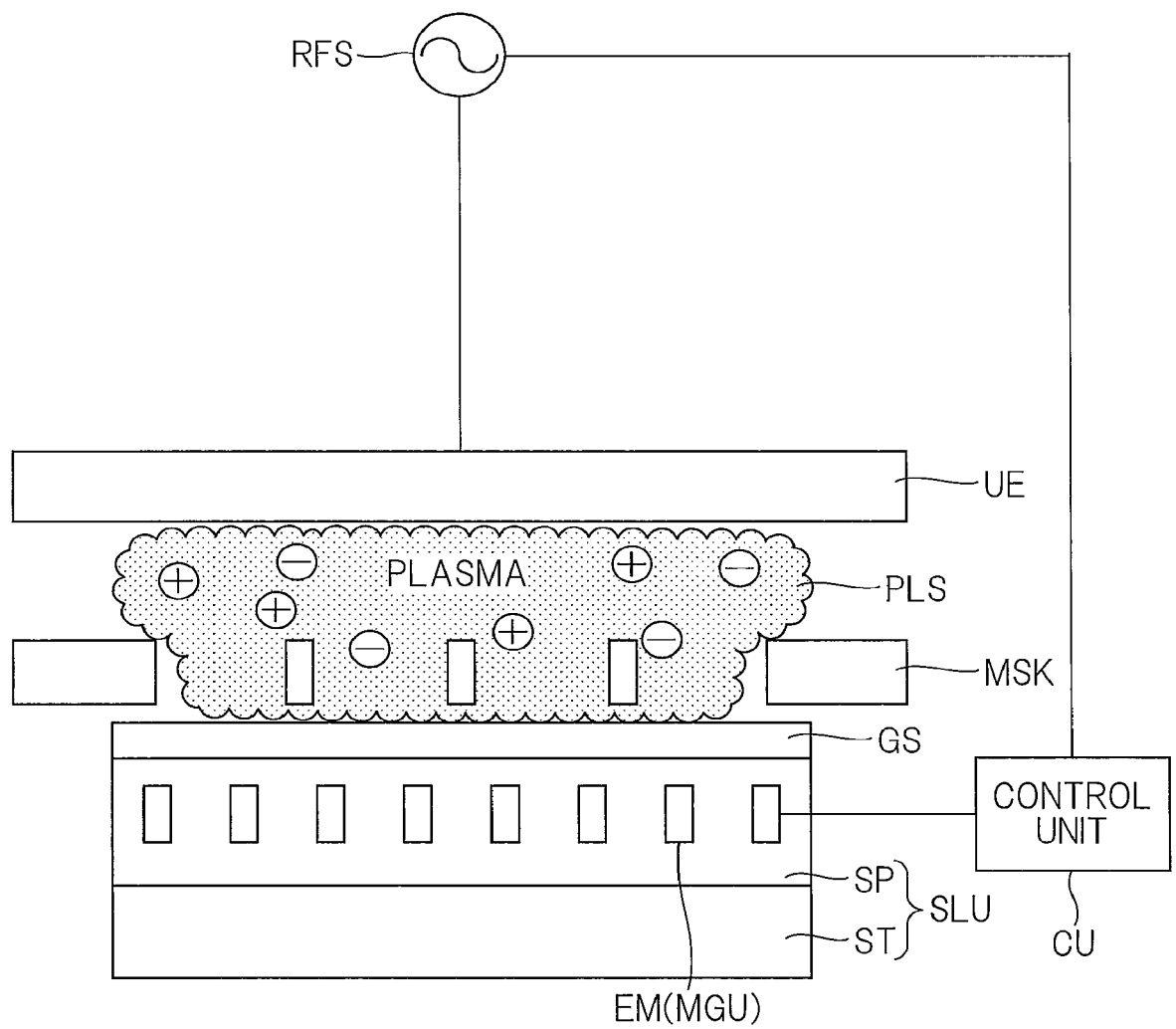
FIG. 26 is a schematic diagram showing a state in which plasma is generated in the process chamber of the plasma atomic layer deposition apparatus according to the embodiment.

Next, FIG. 26 is a schematic diagram showing a state in which plasma is generated in the process chamber of the plasma atomic layer deposition apparatus according to this embodiment. At this time, the reaction gas AG made of, for example, oxygen gas is supplied into the process chamber from the gas supply unit (not shown). At this stage, the control unit CU controls so as to block the current supply to the electromagnet EM. Consequently, the generation of the magnetic field from the electromagnet EM is stopped. As a result, the attraction force does not act on the mask MSK made of a magnetic substance, and the minute gap is present between the mask MSK and the glass substrate GS. On the other hand, at the stage shown in FIG. 26, the control unit CU of the plasma atomic layer deposition apparatus according to this embodiment controls so that the upper electrode UE and the high frequency power source RFS are in a connected state. Consequently, the high frequency voltage is applied to the upper electrode UE from the high frequency power source RFS. As a result, the plasma PLS containing radicals (active species) and charged particles is generated in the film-forming space. Then, the adsorption layer formed over the glass substrate GS by introducing the source gas SG and the reaction gas AG converted into plasma react with each other by the plasma PLS, so that the protection film made of, for example, an aluminum oxide film is formed so as to cover the organic EL element formed in the glass substrate GS. Namely, the protection film is formed in the region of the glass substrate GS exposed from the opening region of the mask MSK. At this time, in this embodiment, the minute gap is present between the mask MSK and the glass substrate GS. Therefore, it is conceivable that the reaction gas converted into plasma enters the minute gap. However, in this embodiment, for example, the minute gap is not present between the mask MSK and the glass substrate GS in the step of supplying the source gas SG shown in FIG. 23. As a result, since the adsorption layer based on the source gas SG is not formed in the minute gap, no chemical reaction occurs even if the reaction gas converted into plasma enters the minute gap. Accordingly, the protection film is not formed in the minute gap between the mask MSK and the glass substrate GS shown in FIG. 26.

Further, as shown in FIG. 26, at the stage in which the plasma PLS is generated, the generation of the magnetic field from the electromagnet EM is stopped. Therefore, according to this embodiment, the Lorentz force does not act on the charged particles constituting the plasma PLS, and the disturbance in the film thickness distribution of the protection film due to the Lorentz force acting on the charged particles can be suppressed.

Figure 27:
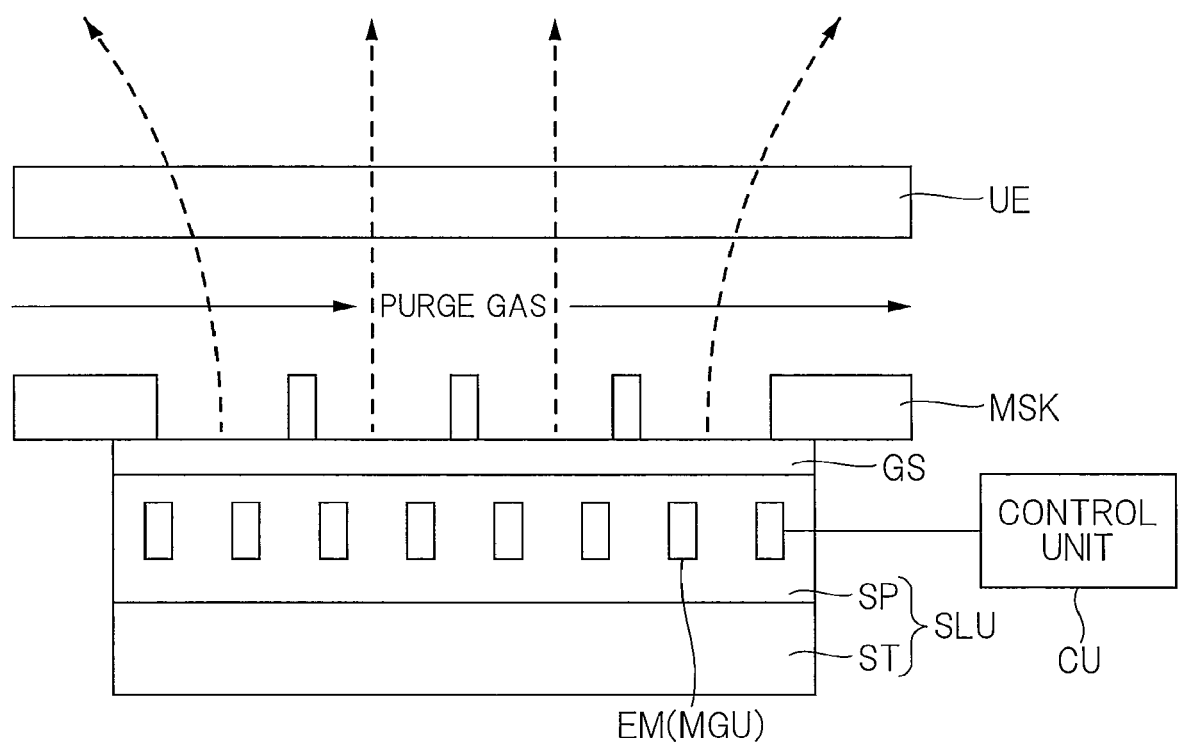
FIG. 27 is a schematic diagram showing a state in which purge gas is introduced into the process chamber of the plasma atomic layer deposition apparatus according to the embodiment.

Subsequently, FIG. 27 is a schematic diagram showing a state in which purge gas is introduced into the process chamber of the plasma atomic layer deposition apparatus according to this embodiment. At this time, the purge gas made of, for example, nitrogen gas is supplied into the process chamber from the gas supply unit (not shown). Consequently, the reaction gas AG remaining in the process space is exhausted from the process space. At this stage, the control unit CU controls to allow a current to flow to the electromagnet EM again. Consequently, the electromagnet EM starts to generate the magnetic field, and the mask MSK made of a magnetic substance is attracted to the electromagnet EM by the magnetic force based on the magnetic field. As a result, the adhesion between the mask MSK and the glass substrate GS is improved, and the minute gap ceases to be present between the mask MSK and the glass substrate GS.

Note that, at the stage shown in FIG. 27, the control unit CU of the plasma atomic layer deposition apparatus according to this embodiment controls so that the upper electrode UE and the high frequency power source are in a non-connected state. Consequently, at the stage shown in FIG. 27, the application of the high frequency voltage to the upper electrode UE is stopped. As a result, the plasma PLS generated in the film-forming space disappears.

In the manner described above, in this embodiment, the protection film made of, for example, an aluminum oxide film can be formed so as to cover the organic EL element formed in the glass substrate GS by the plasma atomic layer deposition method using the mask MSK.

The film-forming method according to this embodiment is the film-forming method using the plasma atomic layer deposition apparatus including the substrate loading unit SLU having the magnetic field generating unit MGU. Also, the film-forming method according to this embodiment includes (a) "a step of loading the substrate over the substrate loading unit SLU", (b) "a step of disposing the mask MSK made of a magnetic substance over the substrate", and (c) "after the step (b), a step of generating the magnetic field from the magnetic field generating unit MGU".

Next, the film-forming method according to this embodiment includes (d) "after the step (c), a step of supplying the source gas SG to the substrate", (e) "a step of stopping the supply of the source gas SG", and (f) "after the step (e), a step of stopping the generation of the magnetic field from the magnetic field generating unit MGU".

Further, the film-forming method according to this embodiment includes (g) "after the step (e), a step of supplying the reaction gas AG to the substrate" and (h) "after the step (f) and the step (g), a step of generating the plasma PLS above the substrate".

At this time, for example, the magnetic field generating unit MGU includes the electromagnet EM, and the magnetic field is generated from the magnetic field generating unit MGU by allowing a current to flow to the electromagnet EM in the step (c).

Note that the substrate contains a material having translucency to visible light. Specifically, the substrate can be configured to contain a glass material or contain a resin material, and the substrate may be a deformable flexible substrate.

Characteristic Point in this Embodiment

Subsequently, the characteristic point in this embodiment will be described. The characteristic point in this embodiment is that the generation and stop of the magnetic field from the magnetic field generating unit is switched during the film-forming process. Consequently, for example, the generation of the magnetic field from the magnetic field generating unit can be stopped during the period when the plasma process is performed. As a result, according to this embodiment, it is possible to prevent the Lorentz force based on the magnetic field from acting on the charged particles constituting the plasma, so that the disturbance in the film thickness distribution of the protection film can be suppressed. On the other hand, during the period of the film-forming process in which the plasma process is not performed, the magnetic field is generated from the magnetic field generating unit. Consequently, the mask made of a magnetic substance is attracted to the magnetic field generating unit, and as a result, the adhesion between the glass substrate loaded over the substrate loading unit in which the magnetic field generating unit is embedded and the mask disposed over the glass substrate can be improved. Accordingly, since the formation of the minute gap between the mask and the glass substrate can be prevented, the entrance of the protection film into the minute gap can be suppressed.

As described above, according to this embodiment, by adopting the characteristic point that the generation and stop of the magnetic field from the magnetic field generating unit is switched during the film-forming process, it is possible to achieve both of the suppression of the entrance of the protection film into the frame region covered with the cover region of the mask and the prevention of the disturbance in the film thickness distribution of the protection film due to the adverse effect on the plasma by the magnetic field.

Namely, when the generation of the magnetic field from the magnetic field generating unit is continued over the entire period of the film-forming process, the adverse effect of the magnetic field acts as the Lorentz force on the charged particles constituting the plasma also during the period when the plasma process is performed. In this case, the distribution of the charged particles in the plasma is disturbed by the Lorentz force, resulting in the disturbance in the film thickness distribution of the protection film. On the other hand, when the generation of the magnetic field by the magnetic field generating unit is not used, the minute gap is formed between the mask and the glass substrate, and the entrance of the protection film occurs in the minute gap. Therefore, the idea (characteristic point) of switching the generation and stop of the magnetic field from the magnetic field generating unit during the film-forming process is extremely useful from the viewpoint of solving the problem described above.

In addition, in this embodiment, in order to embody the idea of switching the generation and stop of the magnetic field from the magnetic field generating unit during the film-forming process, the magnetic field generating unit is composed of the electromagnet. This is because, since the magnetic field can be generated by allowing a current to flow to the electromagnet and no magnetic field is generated when no current flows to the electromagnet, the generation and stop of the magnetic field from the electromagnet (magnetic field generating unit) can be switched by controlling the on and off of the current flowing to the electromagnet. On the other hand, since the permanent magnet always generates the magnetic field, it is not possible to embody the idea of switching the generation and stop of the magnetic field. Therefore, it can be seen that the idea of switching the generation and stop of the magnetic field from the magnetic field generating unit during the film-forming process can be easily realized by composing the magnetic field generating unit from the electromagnet.

Further, when the magnetic field generating unit is composed of the electromagnet, the following advantage can be obtained. For example, although the organic EL element is weak at high temperature, the film-forming temperature is about 80 to 100° C. when the protection film that covers the glass substrate having the organic EL element formed therein is formed by the plasma atomic layer deposition method. At this time, when the magnetic field generating unit is composed of the permanent magnet, the substrate loading unit in which the permanent magnet is embedded is also heated to about 80 to 100° C., and this means that the temperature of about 80 to 100° C. is applied also to the permanent magnet embedded in the substrate loading unit.

Here, it is known that the permanent magnet loses the function as a magnet when it is heated to a high temperature. Therefore, it is difficult to apply the idea of making the mask from a magnetic substance and forcibly attracting the mask to the glass substrate by the magnetic force of the permanent magnet embedded in the substrate loading unit to the process of forming the protection film that covers the glass substrate having the organic EL element formed therein by the plasma atomic layer deposition method. This is because the permanent magnet is heated to a temperature of about 80 to 100° C. in this process, so that the permanent magnet becomes unable to exert the function as a magnet. Namely, although the idea of forcibly attracting the mask to the glass substrate by the magnetic force from the permanent magnet embedded in the substrate loading unit seems useful from the viewpoint of suppressing the formation of the minute gap between the glass substrate and the mask to be the main cause of the entrance of the protection film into the frame region, it is difficult to actually apply the idea to the process of forming the protection film that covers the glass substrate having the organic EL element formed therein by the plasma atomic layer deposition method.

On the other hand, in this embodiment, the magnetic field generating unit is composed of the electromagnet. In this case, unlike the permanent magnet, the electromagnet does not lose the function as a magnet even when it is exposed to a high temperature. Namely, even when the electromagnet is put in a high-temperature state, the magnetic field can be generated from the electromagnet by allowing a current to flow to the electromagnet. As described above, only after the magnetic field generating unit is composed of the electromagnet, the idea of making the mask from a magnetic substance and forcibly attracting the mask to the glass substrate by the magnetic force from the magnetic field generating unit embedded in the substrate loading unit can be applied to the process of forming the protection film that covers the glass substrate having the organic EL element formed therein by the plasma atomic layer deposition method. Therefore, when the magnetic field generating unit is composed of the electromagnet, it is possible to obtain the advantage that the configuration in which the mask is forcibly attracted to the glass substrate by the magnetic force can be effectively applied to the process including the heat treatment as with the process of forming the protection film that covers the glass substrate having the organic EL element formed therein by the plasma atomic layer deposition method.

Further, by composing the magnetic field generating unit from the electromagnet, it is also possible to obtain the advantage that the magnitude of the magnetic field that forcibly attracts the mask to the glass substrate can be adjusted. This is because the magnitude of the magnetic field generated from the electromagnet changes depending on the magnitude of the current flowing to the electromagnet. Therefore, for example, in the case where the minute gap is formed between the mask and the glass substrate and the entrance of the protection film into the minute gap (entrance of the protection film into the frame region covered with the mask) becomes apparent even when the current flowing to the electromagnet is set to a first current value, the magnetic force that attracts the mask can be increased by changing the current flowing to the electromagnet to a second current value larger than the first current value. In this manner, the formation of the minute gap between the mask and the glass substrate can be suppressed without changing the configuration of the electromagnet, so that it is possible to obtain the advantage of being able to flexibly cope with the entrance of the protection film into the minute gap (entrance of the protection film into the frame region covered with the mask).

Verification of Effect of this Embodiment

Finally, the remarkable effect achieved by the technological idea of this embodiment will be described. An aluminum oxynitride (AlON) film functioning as a protection film is formed over a glass substrate of 370 mm×470 mm by using the plasma atomic layer deposition apparatus according to this embodiment. At this time, trimethyl aluminum is used as source gas, and oxygen gas and nitrogen gas are used as reaction gas. The number of cycles (number of repetitions) of the plasma atomic layer deposition method is set to 620 so that the protection film having a thickness of 100 nm is formed over the glass substrate exposed from the opening region of the mask. Under the film-forming conditions described above, the thickness of the protection film is measured at eight measurement points A to H shown in FIG. 28.

Figure 28:
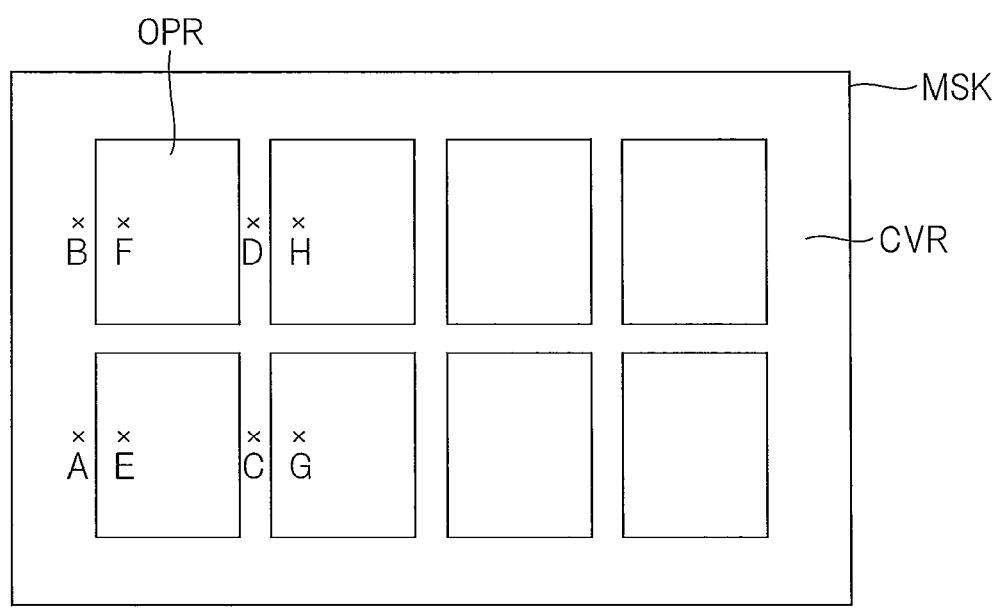
FIG. 28 is a diagram schematically showing points A to H which are measurement points.

FIG. 28 is a diagram schematically showing the points A to H which are measurement points. As shown in FIG. 28, the mask MSK has the cover region CVR and the opening regions OPR formed therein. The points A to D are each located at the position away from an edge of the opening region OPR toward the cover region CVR by 300 km, and the points E to H are each located at the position away from the edge of the opening region OPR toward an inside of the opening region OPR by 300 μm.

Figure 29:
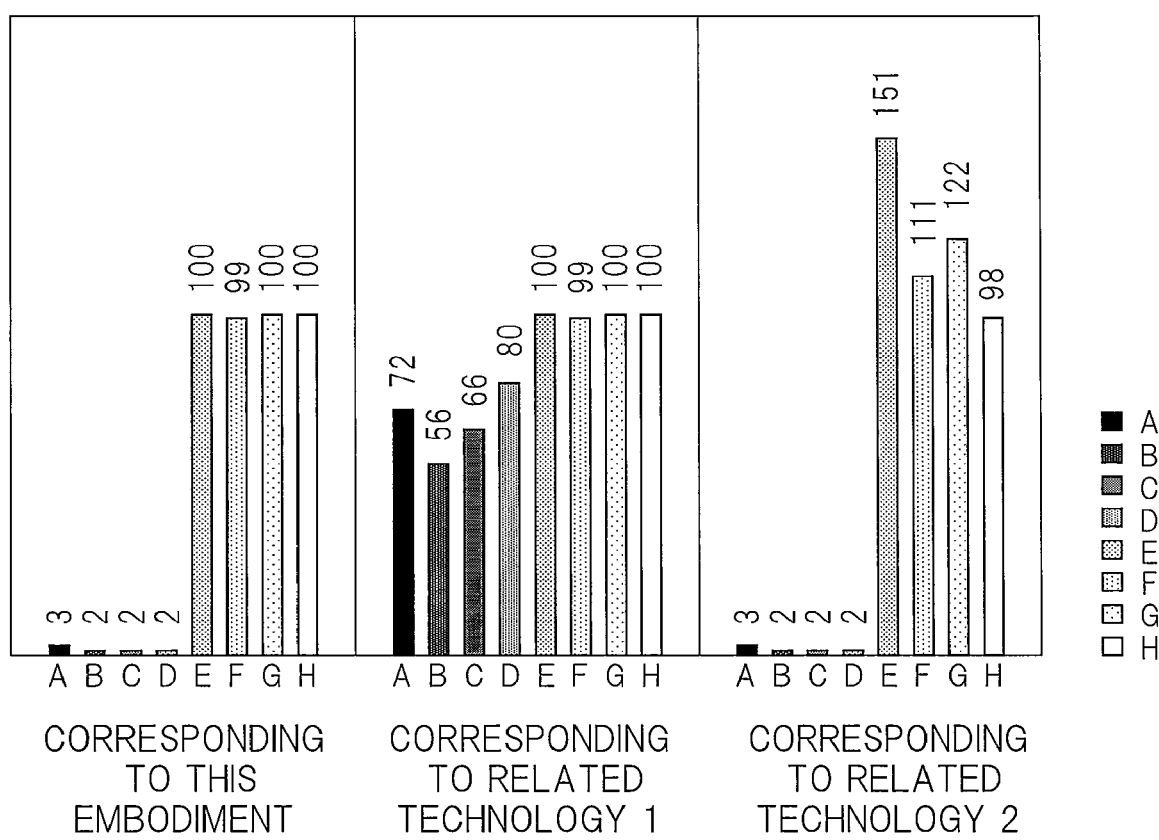
FIG. 29 is a graph showing measurement results of the film thickness of the protection film at the measurement points indicated by the points A to H of FIG. 28.

FIG. 29 is a graph showing measurement results of the thickness of the protection film at the measurement points indicated by the points A to H of FIG. 28. In FIG. 29, the graph on the left side corresponds to this embodiment, that is, the configuration in which the generation and stop of the magnetic field from the magnetic field generating unit is switched so that the generation of the magnetic field from the magnetic field generating unit is stopped during the period when the plasma process is performed and the magnetic field is generated from the magnetic field generating unit during the period of the film-forming process when the plasma process is not performed.

Meanwhile, the graph at the center corresponds to the related technology 1 in which the magnetic field generating unit is not provided, that is, the configuration in which the generation of the magnetic field from the magnetic field generating unit is stopped over the entire period of the film-forming process. In addition, the graph on the right side corresponds to the related technology 2, that is, the configuration in which the magnetic field is generated from the magnetic field generating unit over the entire period of the film-forming process.

As shown in FIG. 29 (graph at the center), it can be seen that the protection film is formed considerably at the points A to D, while the protection film is formed with a substantially uniform thickness at the points E to H in the related technology 1. The results at the points A to D indicate that the protection film enters and is formed over the glass substrate covered with the cover region of the mask. On the other hand, the results at the points E to H indicate that the generation of the magnetic field is not present at the time of generating the plasma, and thus the variation in film thickness (disturbance in film thickness distribution) of the protection film formed over the glass substrate exposed from the opening regions of the mask does not occur. Consequently, it can be seen that the disturbance in the film thickness distribution of the protection film due to the adverse effect on the plasma by the magnetic field can be prevented, but the entrance of the protection film into the frame region covered with the cover region of the mask cannot be suppressed in the related technology 1.

As shown in FIG. 29 (graph on the right side), it can be seen that the protection film is hardly formed at the points A to D, while the protection film is formed with a considerably large variation in film thickness at the points E to H in the related technology 2. The results at the points A to D indicate that the protection film does not enter and is not formed over the glass substrate covered with the cover region of the mask. On the other hand, the results at the points E to H indicate that the generation of the magnetic field is present at the time of generating the plasma, and thus, the variation in film thickness (disturbance in film thickness distribution) of the protection film formed over the glass substrate exposed from the opening regions of the mask occurs. Consequently, it can be seen that the entrance of the protection film into the frame region covered with the cover region of the mask can be suppressed, but the disturbance in the film thickness distribution of the protection film due to the adverse effect on the plasma by the magnetic field cannot be prevented in the related technology 2.

On the other hand, as shown in FIG. 29 (graph on the left side), it can be seen that the protection film is hardly formed at the points A to D, while the protection film is formed with a substantially uniform film thickness at the points E to H in this embodiment. The results at the points A to D indicate that the protection film does not enter and is not formed over the glass substrate covered with the cover region of the mask. On the other hand, the results at the points E to H indicate that the generation of the magnetic field is stopped at the time of generating the plasma, and thus, the variation in film thickness (disturbance in film thickness distribution) of the protection film formed over the glass substrate exposed from the opening regions of the mask does not occur. Consequently, it can be said that this verifies that the technological idea according to this embodiment makes it possible to obtain the remarkable effect of being able to achieve both of the suppression of the entrance of the protection film into the frame region covered with the cover region of the mask and the prevention of the disturbance in the film thickness distribution of the protection film due to the adverse effect on the plasma by the magnetic field.

Namely, it can be seen that the remarkable effect that cannot be obtained by the related technology 1 and the related technology 2 can be obtained by the technological idea according to this embodiment.

In the foregoing, the invention made by the inventors of the present invention has been concretely described based on the embodiments. However, it is needless to say that the present invention is not limited to the foregoing embodiments and various modifications can be made within the scope of the present invention.

REFERENCE SIGNS LIST

AG: reaction gas
CU: control unit
EM: electromagnet
GS: glass substrate
MGU: magnetic field generating unit
MSK: mask
PF: protection film
PLS: plasma
RFS: high frequency power source
SG: source gas
SLU: substrate loading unit

The invention claimed is:

1. A plasma atomic layer deposition apparatus including a processing chamber in which a film is formed over a substrate by plasma processing, the apparatus using a mask made of a magnetic substance disposed over the substrate, the apparatus comprising:
    a substrate loading unit over which the substrate is loaded, the substrate loading unit being provided in the processing chamber;
    an upper electrode provided in the processing chamber and above the substrate loading unit;
    a high frequency power source unit connectable to the upper electrode to supply a high frequency voltage to the upper electrode;
    a magnetic field generating unit provided in the substrate loading unit, the magnetic field generating unit including an electromagnet configured to generate a magnetic field when supplied with a current; and
    a control unit connected to the magnetic field generating unit and to the high frequency power source unit,
    the control unit being configured to execute timing of the magnetic field and plasma generation to ensure that no magnetic field is generated in the electromagnet when plasma is generated in the processing chamber,
    the control unit executing the timing by switching the current flow to the electromagnet OFF when the high frequency voltage is ON and switching the current flow to the electromagnet ON when the high frequency voltage is OFF.

2. The plasma atomic layer deposition apparatus according to claim 1,
    wherein the film is a protection film that protects an organic EL element.

* * * * *